United States Patent
Lysejko et al.

(10) Patent No.: US 10,306,485 B2
(45) Date of Patent: May 28, 2019

(54) CONFIGURABLE ANTENNA AND METHOD OF OPERATING SUCH A CONFIGURABLE ANTENNA

(71) Applicant: Airspan Networks Inc., Boca Raton, FL (US)

(72) Inventors: Martin Lysejko, Bagshot (GB); Andrew Logothetis, High Wycombe (GB); Krzysztof Dudzinski, Slough (GB); Stuart Parrott, Woodstock (GB)

(73) Assignee: AIRSPAN NETWORKS INC., Boca Raton, FL (US)

( * ) Notice: Subject to any disclaimer, the term of this patent is extended or adjusted under 35 U.S.C. 154(b) by 164 days.

(21) Appl. No.: 15/187,188

(22) Filed: Jun. 20, 2016

(65) Prior Publication Data

US 2016/0380353 A1 Dec. 29, 2016

(30) Foreign Application Priority Data

Jun. 25, 2015 (GB) .................................. 1511200.6
Sep. 24, 2015 (GB) .................................. 1516901.4

(51) Int. Cl.
*H01Q 3/12* (2006.01)
*H04W 24/02* (2009.01)
(Continued)

(52) U.S. Cl.
CPC ............ *H04W 24/02* (2013.01); *F16M 11/06* (2013.01); *G01S 3/043* (2013.01); *G01S 3/14* (2013.01);
(Continued)

(58) Field of Classification Search
None
See application file for complete search history.

(56) References Cited

U.S. PATENT DOCUMENTS

| 497,147 A | 5/1893 | Urich |
|---|---|---|
| 3,789,415 A | 1/1974 | Vickland |

(Continued)

FOREIGN PATENT DOCUMENTS

| CN | 1284794 A | 2/2001 |
|---|---|---|
| CN | 104635203 A | 5/2015 |

(Continued)

OTHER PUBLICATIONS

PCT Search Report from PCT/GB2016/051285, dated Jul. 13, 2016, 12 pgs.

(Continued)

*Primary Examiner* — Trinh V Dinh
(74) *Attorney, Agent, or Firm* — Haynes Beffel & Wolfeld LLP

(57) ABSTRACT

An antenna apparatus for use in a wireless network and method of operating such an antenna apparatus are provided. A wireless network controller provides a configuration of such an antenna apparatus, a method of operating such a wireless network controller, and a resulting wireless network. The antenna apparatus comprises a directional antenna and a uniform circular antenna array. The directional antenna can be rotatably positioned about an axis with respect to a fixed mounting portion of the apparatus in dependence on wireless signals received by the antenna array. The antenna array allows the antenna apparatus to receive wireless signals isotropically and thus to accurately monitor the wireless signal environment in which it finds itself. The antenna apparatus can thus monitor and characterize incoming signals, both from external interference sources and from other network nodes, and the directional antenna can then be positioned in rotation to improve the network throughput.

18 Claims, 16 Drawing Sheets

(51) Int. Cl.

| | | |
|---|---|---|
| G01S 19/53 | (2010.01) | |
| G01S 3/14 | (2006.01) | |
| G01S 5/02 | (2010.01) | |
| H01Q 1/02 | (2006.01) | |
| H01Q 3/04 | (2006.01) | |
| H01Q 3/24 | (2006.01) | |
| H01Q 3/26 | (2006.01) | |
| H01Q 21/06 | (2006.01) | |
| H01Q 21/08 | (2006.01) | |
| H01Q 21/20 | (2006.01) | |
| H01Q 21/28 | (2006.01) | |
| H01Q 25/00 | (2006.01) | |
| H04B 7/06 | (2006.01) | |
| H04B 7/08 | (2006.01) | |
| H04W 28/02 | (2009.01) | |
| H04W 88/04 | (2009.01) | |
| H05K 7/20 | (2006.01) | |
| H04L 12/24 | (2006.01) | |
| H04L 29/08 | (2006.01) | |
| H04W 16/28 | (2009.01) | |
| H04W 40/22 | (2009.01) | |
| H04W 72/08 | (2009.01) | |
| H04W 24/10 | (2009.01) | |
| H01Q 1/24 | (2006.01) | |
| H01Q 1/50 | (2006.01) | |
| H01Q 3/10 | (2006.01) | |
| H04W 72/04 | (2009.01) | |
| G01S 3/04 | (2006.01) | |
| G01S 19/24 | (2010.01) | |
| H01Q 1/36 | (2006.01) | |
| H01Q 1/42 | (2006.01) | |
| H01Q 21/00 | (2006.01) | |
| H01Q 1/12 | (2006.01) | |
| H01Q 3/02 | (2006.01) | |
| H01Q 3/36 | (2006.01) | |
| H01Q 21/24 | (2006.01) | |
| H04B 7/0456 | (2017.01) | |
| F16M 11/06 | (2006.01) | |
| H04L 12/26 | (2006.01) | |
| H04W 24/08 | (2009.01) | |
| H04W 28/24 | (2009.01) | |
| H04W 48/06 | (2009.01) | |
| H04W 4/50 | (2018.01) | |
| H04W 84/04 | (2009.01) | |
| H04W 84/02 | (2009.01) | |
| H04W 88/08 | (2009.01) | |

(52) U.S. Cl.
CPC ............ *G01S 5/0247* (2013.01); *G01S 19/24* (2013.01); *G01S 19/53* (2013.01); *H01Q 1/02* (2013.01); *H01Q 1/1207* (2013.01); *H01Q 1/1228* (2013.01); *H01Q 1/246* (2013.01); *H01Q 1/36* (2013.01); *H01Q 1/42* (2013.01); *H01Q 1/50* (2013.01); *H01Q 3/02* (2013.01); *H01Q 3/04* (2013.01); *H01Q 3/10* (2013.01); *H01Q 3/12* (2013.01); *H01Q 3/24* (2013.01); *H01Q 3/26* (2013.01); *H01Q 3/2611* (2013.01); *H01Q 3/36* (2013.01); *H01Q 21/00* (2013.01); *H01Q 21/065* (2013.01); *H01Q 21/08* (2013.01); *H01Q 21/205* (2013.01); *H01Q 21/24* (2013.01); *H01Q 21/28* (2013.01); *H01Q 25/002* (2013.01); *H01Q 25/005* (2013.01); *H04B 7/0456* (2013.01); *H04B 7/0617* (2013.01); *H04B 7/0621* (2013.01); *H04B 7/0691* (2013.01); *H04B 7/0695* (2013.01); *H04B 7/086* (2013.01); *H04B 7/088* (2013.01); *H04B 7/0874* (2013.01); *H04L 41/0806* (2013.01); *H04L 41/0816* (2013.01); *H04L 43/0829* (2013.01); *H04L 67/18* (2013.01); *H04L 67/34* (2013.01); *H04W 4/50* (2018.02); *H04W 16/28* (2013.01); *H04W 24/08* (2013.01); *H04W 24/10* (2013.01); *H04W 28/0236* (2013.01); *H04W 28/0268* (2013.01); *H04W 28/0284* (2013.01); *H04W 28/24* (2013.01); *H04W 40/22* (2013.01); *H04W 48/06* (2013.01); *H04W 72/042* (2013.01); *H04W 72/085* (2013.01); *H04W 88/04* (2013.01); *H05K 7/20* (2013.01); *H01Q 1/1257* (2013.01); *H04B 7/0817* (2013.01); *H04W 84/02* (2013.01); *H04W 84/045* (2013.01); *H04W 88/08* (2013.01)

(56) References Cited

U.S. PATENT DOCUMENTS

| | | | |
|---|---|---|---|
| 3,844,341 | A | 10/1974 | Bimshas, Jr. et al. |
| 4,436,190 | A | 3/1984 | Wentzell |
| 4,599,620 | A | 7/1986 | Evans |
| 4,633,256 | A | 12/1986 | Chadwick |
| 4,959,653 | A | 9/1990 | Ganz |
| 5,049,891 | A | 9/1991 | Ettinger et al. |
| 5,125,008 | A | 6/1992 | Trawick et al. |
| 5,357,259 | A | 10/1994 | Nosal |
| 6,124,832 | A | 9/2000 | Jeon et al. |
| 6,404,385 | B1 | 6/2002 | Croq et al. |
| 6,448,930 | B1* | 9/2002 | Judd ............... H01Q 1/007 343/700 MS |
| 6,486,832 | B1 | 11/2002 | Abramov et al. |
| 6,522,898 | B1 | 2/2003 | Kohno et al. |
| 6,621,454 | B1 | 9/2003 | Reudink et al. |
| 6,934,511 | B1 | 8/2005 | Lovinggood et al. |
| 6,963,747 | B1 | 11/2005 | Elliott |
| 7,062,294 | B1 | 6/2006 | Rogard et al. |
| 7,403,748 | B1 | 7/2008 | Keskitalo et al. |
| 7,515,916 | B1 | 4/2009 | Alexander |
| 7,593,693 | B1 | 9/2009 | Kasapi et al. |
| 7,664,534 | B1 | 2/2010 | Johnson |
| 7,697,626 | B2 | 4/2010 | Wang et al. |
| 8,340,580 | B1 | 12/2012 | Epstein |
| 8,509,724 | B2 | 8/2013 | D'Amico et al. |
| 8,577,416 | B2 | 11/2013 | Nandagopalan et al. |
| 8,630,267 | B1 | 1/2014 | Jin |
| 9,173,064 | B1 | 10/2015 | Spain, Jr. |
| 9,179,360 | B1 | 11/2015 | Vivanco |
| 9,692,124 | B2 | 6/2017 | Caimi et al. |
| 9,698,891 | B2 | 7/2017 | Larsson |
| 9,706,419 | B2* | 7/2017 | Bozier ............ H04W 24/02 |
| 9,924,385 | B2* | 3/2018 | Lysejko ............ H04W 4/50 |
| 9,973,943 | B2 | 5/2018 | Lysejko et al. |
| 10,098,018 | B2* | 10/2018 | Lysejko ............ F16M 11/06 |
| 2002/0042274 | A1 | 4/2002 | Ades |
| 2002/0142779 | A1 | 10/2002 | Goto et al. |
| 2003/0195017 | A1 | 10/2003 | Chen et al. |
| 2003/0228857 | A1 | 12/2003 | Maeki |
| 2004/0077354 | A1 | 4/2004 | Jason et al. |
| 2004/0106436 | A1 | 6/2004 | Ochi et al. |
| 2004/0233103 | A1 | 11/2004 | Toshev |
| 2004/0242274 | A1 | 12/2004 | Corbett et al. |
| 2005/0048921 | A1 | 3/2005 | Chung |
| 2005/0063340 | A1 | 3/2005 | Hoffmann et al. |
| 2005/0157684 | A1 | 7/2005 | Ylitalo et al. |
| 2005/0192037 | A1 | 9/2005 | Nanda et al. |
| 2005/0285784 | A1 | 12/2005 | Chiang et al. |
| 2006/0072518 | A1 | 4/2006 | Pan et al. |
| 2006/0292991 | A1 | 12/2006 | Abramov et al. |
| 2008/0005121 | A1 | 1/2008 | Lam et al. |
| 2008/0123589 | A1 | 5/2008 | Lee et al. |
| 2008/0287068 | A1 | 11/2008 | Etemad |

(56) References Cited

U.S. PATENT DOCUMENTS

| | | |
|---|---|---|
| 2009/0005121 A1 | 1/2009 | Wong et al. |
| 2009/0032223 A1 | 2/2009 | Zimmerman et al. |
| 2009/0046638 A1 | 2/2009 | Rappaport et al. |
| 2009/0067333 A1 | 3/2009 | Ergen et al. |
| 2009/0086864 A1 | 4/2009 | Komninakis et al. |
| 2009/0103492 A1 | 4/2009 | Altshuller et al. |
| 2009/0116444 A1 | 5/2009 | Wang et al. |
| 2009/0207077 A1 | 8/2009 | Hwang et al. |
| 2009/0252088 A1 | 10/2009 | Rao et al. |
| 2009/0274076 A1 | 11/2009 | Muharemovic et al. |
| 2009/0310554 A1 | 12/2009 | Sun et al. |
| 2010/0071049 A1 | 3/2010 | Bahr et al. |
| 2010/0130150 A1 | 5/2010 | D'Amico et al. |
| 2010/0216477 A1 | 8/2010 | Ryan |
| 2010/0240380 A1 | 9/2010 | Yim et al. |
| 2011/0003554 A1 | 1/2011 | Sekiya |
| 2011/0163905 A1 | 7/2011 | Denis et al. |
| 2011/0235569 A1 | 9/2011 | Huang et al. |
| 2011/0244808 A1 | 10/2011 | Shiotsuki et al. |
| 2011/0312269 A1 | 12/2011 | Judd et al. |
| 2012/0002598 A1 | 1/2012 | Seo et al. |
| 2012/0015659 A1 | 1/2012 | Kalyani et al. |
| 2012/0046026 A1 | 2/2012 | Chande et al. |
| 2012/0119951 A1 | 5/2012 | Vollath |
| 2012/0252453 A1 | 10/2012 | Nagaraja et al. |
| 2012/0299765 A1* | 11/2012 | Huang .............. H01Q 3/24 342/81 |
| 2012/0329511 A1 | 12/2012 | Keisu |
| 2013/0203401 A1 | 8/2013 | Ryan et al. |
| 2013/0215844 A1 | 8/2013 | Seol et al. |
| 2014/0256376 A1 | 9/2014 | Weissman et al. |
| 2014/0313080 A1 | 10/2014 | Smith et al. |
| 2015/0078191 A1 | 3/2015 | Jongren et al. |
| 2016/0037550 A1 | 2/2016 | Barabell et al. |
| 2016/0255667 A1 | 9/2016 | Schwartz |
| 2016/0262045 A1 | 9/2016 | Yang et al. |
| 2016/0277087 A1 | 9/2016 | Jo et al. |
| 2016/0377695 A1 | 12/2016 | Lysejko et al. |
| 2016/0380354 A1 | 12/2016 | Bozier et al. |
| 2016/0380355 A1 | 12/2016 | Lysejko et al. |
| 2016/0380363 A1 | 12/2016 | Logothetis |
| 2016/0381570 A1 | 12/2016 | Lysejko et al. |
| 2016/0381574 A1 | 12/2016 | Dudzinski et al. |
| 2016/0381585 A1 | 12/2016 | Dudzinski et al. |
| 2016/0381590 A1 | 12/2016 | Lysejko et al. |
| 2016/0381591 A1 | 12/2016 | Lysejko et al. |
| 2016/0381698 A1 | 12/2016 | Grinshpun et al. |
| 2017/0111181 A1 | 4/2017 | Zhou |
| 2017/0280314 A1 | 9/2017 | Yang et al. |
| 2018/0213417 A1* | 7/2018 | Lysejko .............. F16M 11/06 |

FOREIGN PATENT DOCUMENTS

| | | |
|---|---|---|
| EP | 0654915 A2 | 5/1995 |
| EP | 1903348 A1 | 3/2008 |
| EP | 2113145 A1 | 11/2009 |
| EP | 2207267 A2 | 7/2010 |
| EP | 2391157 A2 | 11/2011 |
| EP | 2448144 A1 | 5/2012 |
| EP | 2506625 A1 | 10/2012 |
| EP | 2538712 A1 | 12/2012 |
| GB | 2318914 A | 5/1998 |
| GB | 2484377 A | 4/2012 |
| JP | H05188128 A | 7/1993 |
| JP | H06188802 A | 7/1994 |
| KR | 101346062 B1 | 12/2013 |
| WO | 9426001 A1 | 11/1994 |
| WO | 199965105 A1 | 12/1999 |
| WO | 0152447 A2 | 7/2001 |
| WO | 0231908 A2 | 4/2002 |
| WO | 03096560 A1 | 11/2003 |
| WO | 2004095764 A2 | 11/2004 |
| WO | 2004114546 A1 | 12/2004 |
| WO | 2005064967 A1 | 7/2005 |
| WO | 2007010274 A1 | 1/2007 |
| WO | 2007069809 A1 | 6/2007 |
| WO | 2008/064696 A1 | 6/2008 |
| WO | 2008111882 A1 | 9/2008 |
| WO | 2008151057 A2 | 12/2008 |
| WO | 2010077790 A1 | 7/2010 |
| WO | 2011044947 A1 | 4/2011 |
| WO | 2011060058 A1 | 5/2011 |
| WO | 2014106539 A1 | 7/2014 |

OTHER PUBLICATIONS

UK Search Report from GB 1519237.0, dated Jun. 10, Apr. 2016, 3 pgs.
Office Action in related Case U.S. Appl. No. 15/186,134 dated Nov. 22, 2016, 18 pages.
Office Action in related Case U.S. Appl. No. 15/187,515 dated Dec. 7, 2017, 9 pages.
U.S. Notice of Allowance from U.S. Appl. No. 15/182,209 dated Nov. 22, 2017, 13 pages.
U.S. Notice of Allowance from U.S. Appl. No. 15/187,574 dated Dec. 15, 2017, 14 pages.
PCT Search Report from PCT/GB2016/051428 (corresponding to U.S. Appl. No. 15/187,188), dated Dec. 13, 2016, 19 pgs.
UK Search Report from GB 1514938.8, dated Apr. 18, 2016, 4 pgs.
UK Search Report from GB 1516901.4, dated Mar. 18, 2016, 5 pgs.
UK Search Report from GB 1518654.7, dated Mar. 24, 2016, 3 pgs.
UK Search Report from GB 1519216.4, dated Apr. 15, 2016, 5 pgs.
UK Search Report from GB 1519220.6, dated Apr. 4, 2016, 4 pgs.
UK Search Report from GB 1519228.9, dated Apr. 29, 2016, 4 pgs.
UK Search Report from GB 1519270.1, dated Apr. 25, 2016, 5 pgs.
UK Search Report from GB 1519272.7, dated Jun. 10, 2016, 3 pgs.
UK Search Report from GB 1519273.5, dated Apr. 27, 2016, 3 pgs.
Doi et al., "Low-Cost Antenna Array via Antenna Switching for High Resolution 2-D DOA Estimation," SIPS 2013 Proc. IEEE, Oct. 16, 2013, pp. 83-88.
Jung et al., "Attitude Sensing Using a GPS Antenna on a Turntable: Experimental Tests," Navigation, J. of the Institute of Navigation, Fairfax, VA, US, vol. 51, No. 3, Dec. 1, 2004, pp. 221-230.
PCT Search Report from PCT/GB2016/051234 (corresponding to U.S. Appl. No. 15/187,570), dated Aug. 5, 2016, 13 pgs.
PCT Search Report from PCT/GB2016/051360 (corresponding to U.S. Appl. No. 15/187,900), dated Aug. 19, 2016, 12 pgs.
PCT Search Report from PCT/GB2016/051615 (corresponding to U.S. Appl. No. 15/187,515), dated Aug. 12, 2016, 13 pgs.
PCT Search Report from PCT/GB2016/051617 (corresponding to U.S. Appl. No. 15/187,616), dated Aug. 23, 2016, 11 pgs.
PCT Search Report from PCT/GB2016/051618 (corresponding to U.S. Appl. No. 15/187,602), dated Aug. 12, 2016, 12 pgs.
PCT Search Report from PCT/GB2016/051759 (corresponding to U.S. Appl. No. 15/187,680), dated Sep. 14, 2016, 15 pgs.
PCT Search Report from PCT/GB2016/051195, dated Jul. 25, 2016, 13 pgs.
PCT Search Report from PCT/GB2016/051205, dated Jul. 25, 2016, 13 pgs.
U.S. Appl. No. 15/187,570—Office Action dated Feb. 27, 2018, 16 pages.
U.S. Appl. No. 15/187,602—Office Action dated Feb. 22, 2018, 19 pages.
U.S. Notice of Allowance from U.S. Appl. No. 15/186,134 dated Mar. 14, 2017, 8 pages.
U.S. Office Action in U.S. Appl. No. 15/182,209 dated Apr. 13, 2017, 17 pages.
PCT Written Opinion from PCT/GB2016/051195, dated May 17, 2017, 5 pgs.
PCT Written Opinion from PCT/GB2016/051205, dated May 16, 2017, 5 pgs.
PCT Written Opinion from PCT/GB2016/051234, dated May 17, 2017, 10 pgs.
PCT Written Opinion from PCT/GB2016/051285, dated May 10, 2017, 5 pgs.
PCT Written Opinion from PCT/GB2016/051360, dated Jun. 1, 2017, 6 pgs.

(56) References Cited

OTHER PUBLICATIONS

PCT Written Opinion from PCT/GB2016/051428, dated Jun. 2, 2017, 12 pgs.
PCT Written Opinion from PCT/GB2016/051615, dated May 17, 2017, 5 pgs.
PCT Written Opinion from PCT/GB2016/051759, dated May 18, 2017, 6 pgs.
Office Action in related Case U.S. Appl. No. 15/187,680 dated Nov. 3, 2017, 8 pages.
Office Action in related Case U.S. Appl. No. 15/187,574 dated May 15, 2018, 13 pages.
U.S. Notice of Allowance from U.S. Appl. No. 15/187,515 dated May 4, 2018, 8 pages.
U.S. Notice of Allowance from U.S. Appl. No. 15/187,616 dated Jan. 9, 2018, 12 pages.
U.S. Notice of Allowance from U.S. Appl. No. 15/187,680 dated May 21, 2018, 8 pages.
U.S. Office Action in U.S. Appl. No. 15/187,574 dated Dec. 15, 2017, 14 pages.

\* cited by examiner

CONFIGURABLE ANTENNA AND METHOD OF OPERATING SUCH A CONFIGURABLE ANTENNA

CROSS-REFERENCE TO OTHER APPLICATIONS

This application claims priority under 35 U.S.C. 119(b) to UK Application No. 1511200.6, filed 25 Jun. 2015 and entitled "STEERABLE ANTENNA SYSTEM", and to UK Application No. 1516901.4, filed 24 Sep. 2015 and entitled "A CONFIGURABLE ANTENNA AND METHOD OF OPERATING SUCH A CONFIGURABLE ANTENNA". Both applications are incorporated by reference herein.

TECHNICAL FIELD

The present disclosure relates to wireless networks. More particularly it relates to an antenna apparatus used as a node in a wireless network.

BACKGROUND

A wireless network may be provided to serve a range of different functions, but one use of a wireless network is to perform backhaul in a communications network where user equipment devices (e.g. mobile telephones) communicate with nodes of the wireless network and the wireless network then enables these nodes to communicate with other nodes of the wireless network, which then connect (typically in a wired manner) to a physical communications infrastructure and then on to a wired communications network such as the internet. There are a number of different use cases and different types of backhaul technologies available to mobile network operators, but in this context there are a number of reasons why it would be desirable to provide terminal nodes of a wireless backhaul network (also referred to herein as feeder terminals) which only communicate with user equipment within a relatively small cell. Small cell deployment can be useful to provide the enhanced quality of service demanded by the ever increasing number of mobile data consumers. Small cells have a number of advantages such as: they allow capacity hot-spots to be targeted to ease congestion, they are appropriate for deploying in a dense outdoor urban environment, for example on street furniture, and they can be deployed in specific known "not-spots" where macrocell coverage is poor or within indoor not-spots which experience steady daily traffic with occasional significant peaks, such as dense urban indoor environments like stadiums, shopping malls, and so on. Further, small cells may also be appropriate for mobile deployment, such as in trains, or other moving transport.

In the wireless backhaul use case discussed above, a feeder terminal (FT), i.e. the backhaul node nearest to an access point (AP), which may for example be an eNodeB (eNB) in the context of LTE, may typically be mounted on street furniture or a building façade perhaps 3-6 meters above street level. Conversely, a feeder base (FB), i.e. the backhaul node nearest to the core network, utilises the same infrastructure as the access macro network.

In view of the above usage context, it is inevitable that some degree of outage will occur when the backhaul connectivity is unavailable. Outage may for example occur when there is equipment failure, or a persistent or temporary physical obstruction such as heavy rain or vehicles in the line of sight of the backhaul link. Although the use of small cells may enable the target availability of the connectivity to be relaxed, it would advantageous if the nodes of the wireless network were able to reconfigure themselves to provide different communications paths when such outage does occur. Moreover, given the greater number of FTs which need to be deployed when smaller cells are used, in order to facilitate fast, large scale deployment with little engineering required at a new installation site, the ability for the nodes (both FTs and FBs) to self-organise and self-configure is very desirable.

In the context of wireless networks, a further consideration which may need to be allowed for is the carrier frequency in which the wireless network operates, both in terms of the corresponding propagation which the carrier frequency allows, but also in terms of the regulatory licencing regimes which apply to a given carrier frequency. Whilst it would be advantageous to provide a wireless network which operates in a licence-exempt frequency band, due to its free availability, the lack of official regulation in such an unlicensed band means that the wireless network must be able to cope with co-channel and adjacent channel interference from unsolicited and uncoordinated wireless sources and furthermore despite any initial well planned deployment, if the wireless network is to be durable (in time) it must be able to adapt rapidly to static or dynamic, fixed or mobile radio traffic from other sources. One possible approach to the provision of a wireless backhaul network in such an environment would be the use of a contention-based protocol such as IEEE802.11 (WiFi), but then care must be exercised to ensure that the access does not interfere with the backhaul by separating the two air interfaces into separate bands, yet nonetheless other mobile devices or operators may still use the same spectrum causing significant interference. Although the widespread availability of WiFi may represent a cheaper approach, WiFi cannot quickly address rapid spatial and temporal interference pattern variations, making it in practice less suitable for the stringent requirements of real time backhaul services. Moreover the use of WiFi can be expected to require careful engineering and to be used in narrow point-to-point modes, which limits its deployment possibilities.

SUMMARY

In one example embodiment there is an antenna apparatus for communication via a wireless network comprising: a directional antenna; a uniform circular antenna array; and a mounting portion configured to be fixed relative to a physical location of the antenna apparatus, wherein the directional antenna is configured to be rotatably positioned about an axis with respect to the mounting portion in dependence on wireless signals received by the uniform circular antenna array.

The antenna apparatus has a directional antenna. This antenna is "directional" in the sense that the configuration of the antenna enables the antenna to utilise a beam pattern (both in reception and transmission) which has a notable degree of directionality. This may for example be achieved by electronic control (e.g. activation, gain, phase shift and so on) of selected antenna components, such that a selected beam pattern that they together form presents such directionality. By contrast the antenna apparatus also has a uniform circular antenna array, which has a configuration that is generally circularly symmetrical, for example having a set of antenna components which are evenly distributed to form a circle, allowing this uniform circular antenna array to transmit and receive wireless signals isotropically.

In the context of the present techniques the use of the uniform circular antenna array to receive wireless signals isotropically is particularly relevant because this allows the antenna apparatus, in parallel to the main data path which it operates by means of the directional antenna, to monitor the wireless signal environment in which the antenna apparatus finds itself. In particular, this enables the antenna apparatus to monitor and characterise incoming signals, which may originate from other nodes in the network in which the antenna apparatus is participating, or may come from other uncoordinated wireless equipment or devices not belonging to the network.

The antenna apparatus further comprises a mounting portion configured to be fixed relative to a physical location of the antenna apparatus, wherein the directional antenna is configured to be rotatably positioned about an axis with respect to the mounting portion. As mentioned above, the directional antenna of the present techniques may be provided with an advantageous degree of electronic configurability, but its configurability is even greater if the directional antenna itself can be physically rotated around a fixed axis (fixed relative to the physical location of the antenna apparatus, e.g. on an immovable object such as street furniture or a building), and whilst this rotational position in azimuth about this axis could be chosen when installing the antenna apparatus, the present techniques recognise that a yet greater degree of configurability of the antenna apparatus, and hence of the wireless network in which it participates as a whole, is provided if the directional antenna can be rotatably positioned in operation about this axis. Specifically the present techniques provide that the rotational positioning occurs in dependence on wireless signals received by the uniform circular antenna array, and thus the antenna apparatus is able to monitor wireless signals which it receives and then position the directional antenna with respect to the fixed axis, such that for example interference from sources outside the network is reduced and/or the throughput of network data passing through the antenna apparatus is improved. It should be noted that this not only enables the antenna apparatus to be rapidly deployed and to configure itself shortly after physical deployment for participation in its wireless network, but also enables the antenna apparatus to adapt its configuration in operation to ensure that network throughput is maintained at a high level and that new interference sources can be identified and compensated for.

The manner in which the antenna apparatus is capable of monitoring and characterising incoming signals may take a variety of forms, but in some embodiments the uniform circular antenna array comprises monitoring circuitry configured to generate signal strength information and direction information for the wireless signals received, and the directional antenna is configured to be rotatably positioned about the axis with respect to the mounting portion in dependence on the signal strength information and the direction information. The generation of this signal strength information and direction information thus enables the antenna apparatus to characterise both signals which are identified as coming from another antenna apparatus in the network and signals which are identified as coming from "external" sources which are not part of the network. The rotational position of the directional antenna about the axis can then be selected to achieve a balance between avoiding the external interference sources (e.g. orienting the directional antenna so as not to be pointed towards a known source of interference) and improving the wireless communication with another antenna apparatus of the same network (e.g. where this antenna apparatus only communicates with one other antenna apparatus in the network, other factors notwithstanding this would ideally be an orientation which provides line of sight orientation of the directional antenna to that one other antenna apparatus).

The signal strength information and the direction information may be handled in a variety of ways. In some embodiments the antenna apparatus is configured to send the signal strength information and the direction information to a wireless network controller, and is configured to position the directional antenna about the axis with respect to the mounting portion in accordance with a rotational positioning instruction received from the wireless network controller. It should be understood that the wireless network controller therefore does not typically form part of the antenna apparatus, but rather would generally form another component of the wireless network in which the antenna apparatus is participating. Moreover, the wireless network controller will then also typically not only receive signal strength information and direction information from one antenna apparatus, but rather will gather these items of information from many antenna apparatuses which fall under its control in order to form the wireless network. The wireless network controller can then coordinate the configuration of these many antenna apparatuses such that they operate together in an efficient manner which provides high overall network data throughput. The antenna apparatus in such an embodiment is therefore configured to send the signal strength information and direction information to the wireless network controller and in return to receive a rotational positioning instruction received from the wireless network controller, which has been generated by the wireless network controller to cause the antenna apparatus to position its directional antenna with respect to its own axis.

However, the antenna apparatus need not be reliant on a wireless network controller in order to determine its rotational position, and accordingly in some embodiments the antenna apparatus is configured to determine a rotational position for the directional antenna in dependence on the signal strength information and the direction information, and is configured to position the directional antenna about the axis with respect to the mounting portion in accordance with the rotational position determined. Thus, the antenna apparatus in such embodiments can therefore locally (independently) perform an assessment of its environment and choose its own directional orientation in dependence on the outcome of that assessment. This may for example be useful immediately after the antenna apparatus is physically deployed, so that the antenna apparatus can initially rotationally position itself, perhaps before then being instructed by the above-mentioned wireless network controller to adjust the rotational position due to the overview that the wireless network controller has of the wider network, which overview is not directly available to the antenna apparatus. The ability locally to perform an assessment of the wireless environment and choose its own directional orientation also has the benefit that bandwidth for data communication within the wireless network does not need to be sacrificed in order to communicate the signal strength information and the direction information to a wireless network controller and to receive the rotational positioning instruction in return. Nevertheless, the present techniques also provide that the impact of such configuration communication within the network can be kept low by arranging the antenna apparatus to gather such wireless signals received by its uniform circular antenna array and generate the signal strength information and direction information as a background process over the course of the day, say, and then only to transmit the signal strength information and direction information at a predetermined time, when it is expected that the demands being placed on the network for data communication are rather low, for example at 3 am.

A degree of coordination between the antenna apparatus and another antenna apparatus in the wireless network may also be provided in order to enable the antenna apparatus better to assess the wireless environment in which it finds itself. Accordingly in some embodiments the uniform circular antenna array is configured to transmit a predetermined characteristic signal, and the antenna apparatus is configured to coordinate its operation with respect to at least one other antenna apparatus so that the antenna apparatus and the at least one other antenna apparatus transmit the predetermined characteristic signal at mutually exclusive times. In this way a "sounding" procedure carried out by the antenna apparatus and the at least one other antenna apparatus may be supported, wherein only one antenna apparatus transmits the predetermined characteristic signal at a time and the other antenna apparatuses listen for the predetermined characteristic signal. This enables the antenna apparatus to identify other antenna apparatuses which belong to the wireless network, and then to generate the signal strength information and the direction information only for those known participants in the wireless network, by virtue of the fact that the predetermined characteristic signal can be chosen to be such that when identified it can only have come from another antenna apparatus which is participating in the sounding procedure of the wireless network.

However as mentioned above it is not only useful for the antenna apparatus to identify other antenna apparatuses in the wireless network and to be configured to improve data throughput in communication with those antenna apparatuses, but it is also useful for the antenna apparatus to identify external interference sources such that these where possible can be avoided or at least their influence reduced. Accordingly in some embodiments the antenna apparatus is configured to coordinate its operation with respect to at least one other antenna apparatus so that the antenna apparatus and the at least one other antenna apparatus receive the wireless signals by their respective uniform circular antenna arrays in a period when none of the antenna apparatus and the at least one other antenna apparatus are transmitting. Hence in this example a coordinated period is defined for the antenna apparatus and the at least one antenna apparatus when none of these antenna apparatuses are transmitting. By monitoring the wireless environment in which it finds itself by means of the wireless signals received by its uniform circular antenna array during this period, the antenna apparatus can identify and characterise those external interference sources.

The particular manner in which the directional antenna of the antenna apparatus can be positioned in rotation about its axis may take a variety of forms, but in some embodiments the antenna apparatus further comprises a motor arrangement to position the directional antenna in rotation about the axis with respect to the mounting portion. This then it provides the antenna apparatus with the ability to select the rotational position in azimuth of the directional antenna around the axis in an efficient manner that is readily electronically controllable.

The extent to which the directional antenna can be positioned with respect to the axis may vary, there being for example situations which can be envisaged in which an antenna apparatus may be physically located in such a position that rotational positioning only up to approximately 180° is meaningful, for example when mounted on the side of a building, or for example up to approximately 270° when mounted on the corner of the building, but an advantageously adaptable antenna apparatus, suitable for deployment in many different physical locations, is provided by embodiments in which the directional antenna is rotatable through a full rotation about the axis with respect to the mounting portion. This full rotation may be provided by enabling the directional antenna to be rotated through 360°, but in order to ensure that such full rotation is supported (allowing for various tolerances and unexpected hindrance) the antenna apparatus may be configured to be able to rotate the directional antenna by more than this, for example through 400° (e.g. ±200° from a nominal central position).

Whilst in the light of the above discussion it will be clear that it is necessary for the directional antenna to be able to be rotatably positioned, the uniform circular antenna array could be fixed in position with respect to the axis. However in some embodiments the uniform circular antenna array is fixedly mounted with respect to the directional antenna. This then means that when the directional antenna is rotated the uniform circular antenna array rotates with it. The wireless signals received by the uniform circular antenna array must then be processed taking into account the position in rotation about the axis.

The directional antenna may be variously provided, but in some embodiments the directional antenna is a uniform linear antenna array. This type of directional antenna, in particular due to the regular and repeating pattern of the antenna array components of a uniform linear antenna array, provides a configuration that is both low cost (due to the repeated nature of the physical components) and one that is readily electronically configurable to give a wide range of beam patterns.

In some embodiments the antenna apparatus comprises linear array control circuitry for the uniform linear antenna array, wherein the linear array control circuitry comprises a set of switches for array elements of the uniform linear antenna array configured to control gain and phase of the array elements such that the uniform linear antenna array is operated with a selected beam pattern of a set of beam patterns, wherein the set of beam patterns provides a range of directionality and interference nulling. Selective configuration of the antenna apparatus is thus supported by the set of switches, in particular in terms of the gain and phase of its array elements, so that overall the set of beam patterns available to the antenna apparatus for use by its directional antenna is advantageously diverse. In particular, this type of electronic control over the array elements allows, on the one hand, the creation of strong beam pattern lobes (giving the antenna good directionality in the direction of a lobe or lobes), and on the other hand the creation of nulls with significant attenuation (which can be directed towards external interference sources to reduce their influence). Further, in combination with the fact that the directional antenna is positionable with respect to the axis, enables the antenna apparatus to adapt to a wide range of environments both in terms of being able to provide directional, strongly focused communication with one or more antenna apparatuses of the wireless network, for example by selecting beam pattern which has a single lobe which can be directed towards a single antenna apparatus (when operating in point-to-point mode), or by selecting a broader beam pattern which may have more than one lobe which can each be directed towards a corresponding antenna apparatus (when operating in point-to-multi-point mode). Conversely the selection of a beam pattern which has at least one deep null, in combination with the physical rotation of the directional antenna, enables the at least one deep null to be oriented towards an external interference source, such that its detrimental effect on throughput via the antenna apparatus is reduced.

In some embodiments the antenna apparatus further comprises a rear directional antenna, wherein the rear directional antenna is fixedly mounted with respect to the directional antenna, and wherein the rear directional antenna is oriented in a substantially opposite direction to the directional antenna. The additional provision of a rear directional antenna gives the opportunity for the range of shapes of beam pattern generated by the antenna apparatus to be commensurately larger, and of course to provide the antenna apparatus with an improved ability to also communicate with another antenna "behind" it, in particular when the (front) directional antenna is required to employ a beam pattern which is strongly focused towards the front direction. This is also supported by the fact that the rear directional antenna is fixedly mounted with respect to directional antenna.

The rear directional antenna could take a variety of forms, but in some embodiments the rear directional antenna is a rear uniform linear antenna array. As mentioned above, this type of antenna provides a configuration that is both low cost (due to the repeated nature of the physical components) and one that is readily electronically configurable to further support a wide range of beam patterns for the antenna apparatus.

The relative number of array elements in the directional antenna and in the rear uniform linear antenna array may vary, but in some embodiments the rear uniform linear antenna array comprises fewer array elements than the directional antenna. Whilst of course a yet greater degree of configurability in terms of beam patterns would be supported by providing the rear uniform linear array with as many array elements as there are in the directional antenna, this would of course not only come at greater cost, but also likely result in a physically larger antenna apparatus. A smaller rear uniform linear antenna array thus presents an advantageous balance between being able better to communicate in the rear direction, and maintaining a low cost and compact antenna apparatus.

The antenna apparatus may play a number of different roles in the wireless network, depending on its physical location and intended purpose, and accordingly in some embodiments the antenna apparatus is configured to communicate with more than one other antenna apparatus in the wireless network concurrently. In other words the antenna apparatus may operate in a point-to-multi-point mode. In other embodiments the antenna apparatus may operate in a point-to-point mode, i.e. only communicating with one other antenna apparatus in the wireless network. In some embodiments the antenna apparatus is configured to operate as a hub node in the wireless network. Operating in such a hub mode, the antenna apparatus may then support communication between two other antenna apparatuses, which communicate with one another via this antenna apparatus. In some embodiments the antenna apparatus is configured to operate as a terminal node in the wireless network. As such the antenna apparatus may then communicate with one or more other antenna apparatuses in order to support communication of those one or more other antenna apparatuses with a further device (i.e. not an antenna apparatus according to the present techniques). For example the antenna apparatus in one embodiment could provide connectivity into a wireless backhaul network for an eNodeB.

The wireless network in which the antenna apparatus participates may take a variety of forms, but in some embodiments the wireless network is a backhaul network and then the antenna apparatus may be configured to operate as a backhaul node in the wireless network.

In one example embodiment there is a method of operating an antenna apparatus for communication via a wireless network, wherein the antenna apparatus comprises a directional antenna, a uniform circular antenna array, and a mounting portion configured to be fixed relative to a physical location of the antenna apparatus, the method comprising the steps of: receiving wireless signals via the uniform circular antenna array; and positioning the directional antenna in rotation about an axis with respect to the mounting portion in dependence on the wireless signals received by the uniform circular antenna array.

In one example embodiment there is an antenna apparatus for communication via a wireless network comprising: means for directionally transmitting and receiving wireless signals; means for transmitting and receiving wireless signals in a uniform circular manner; means for mounting the antenna apparatus fixedly relative to a physical location of the antenna apparatus; and means for positioning the directional antenna in rotation about an axis with respect to the means for mounting the antenna apparatus in dependence on the wireless signals received by the uniform circular antenna array.

In one example embodiment there is an apparatus for controlling a wireless network comprising: an input to receive signal strength information and direction information from at least one antenna apparatus in the wireless network; configuration optimisation circuitry to perform an iterative wireless network optimisation procedure to determine at least one rotational position for the at least one antenna apparatus on the basis of the signal strength information and the direction information received, wherein the iterative wireless network optimisation procedure iterates in a direction of reduced interference for the at least one antenna apparatus; and instruction transmission circuitry configured to send at least one rotational positioning instruction to at least one antenna apparatus in the wireless network to cause the at least one antenna apparatus to rotationally position its directional antenna in accordance with the at least one rotational positioning instruction.

Such a wireless network controller can be provided to determine an improved configuration (where such exists) for the wireless network, in particular in terms of the rotational position of at least one of the antenna apparatuses in the wireless network, by carrying out its iterative wireless network optimisation procedure. This may for example comprise noting the current network throughput with the current rotational position of the at least one antenna apparatus, and performing a calculation to estimate a change in the network throughput if a variation were to be made to the current rotational position of the at least one antenna apparatus. Where this variation is calculated to improve the current network throughput, for example by resulting in reduced interference for that at least one antenna apparatus, the wireless network controller can then select that varied rotational position and continue the iterative procedure whilst adjustment to the rotational position is calculated to yet further reduce interference. Once the wireless network controller determines that an improved rotational position has been determined for the at least one antenna apparatus it can communicate this "optimal" rotational position to the at least one antenna apparatus by means of the rotational positioning instruction.

In the light of the above discussion it will be appreciated that network optimisation may not only take place on the basis of the rotational position of the antenna apparatuses, but also in terms of the beam pattern which each antenna apparatus uses. Accordingly in some embodiments the iterative wireless network optimisation procedure further comprises determining a selected beam pattern from a set of beam patterns for the directional antenna of the at least one antenna apparatus. This selected beam pattern is then also communicated to the antenna apparatus in association with rotational positioning instruction, so that the antenna apparatus can then both position itself rotationally and use the appropriate beam pattern, as selected for it by the wireless network controller.

In one example embodiment there is a method of controlling a wireless network comprising the steps of: receiving signal strength information and direction information from at least one antenna apparatus in the wireless network; performing an iterative wireless network optimisation procedure to determine at least one rotational position for the at least one antenna apparatus on the basis of the signal strength information and the direction information received, wherein the iterative wireless network optimisation procedure iterates in a direction of reduced interference for the at least one antenna apparatus; and transmitting at least one rotational positioning instruction to at least one antenna apparatus in the wireless network to cause the at least one antenna apparatus to rotationally position its directional antenna in accordance with the at least one rotational positioning instruction.

In one example embodiment there is an apparatus for controlling a wireless network comprising: means for receiving signal strength information and direction information from at least one antenna apparatus in the wireless network; means for performing an iterative wireless network optimisation procedure to determine at least one rotational position for the at least one antenna apparatus on the basis of the signal strength information and the direction information received, wherein the iterative wireless network optimisation procedure iterates in a direction of reduced interference for the at least one antenna apparatus; and means for transmitting at least one rotational positioning instruction to at least one antenna apparatus in the wireless network to cause the at least one antenna apparatus to rotationally position its directional antenna in accordance with the at least one rotational positioning instruction.

In one example embodiment there is a wireless network comprising: at least two antenna apparatuses as described above; and the wireless network controller as described above.

BRIEF DESCRIPTION OF THE DRAWINGS

The present techniques will be described further, by way of example only, with reference to embodiments thereof as illustrated in the accompanying drawings, in which.

DESCRIPTION OF EMBODIMENTS

Figure 1:
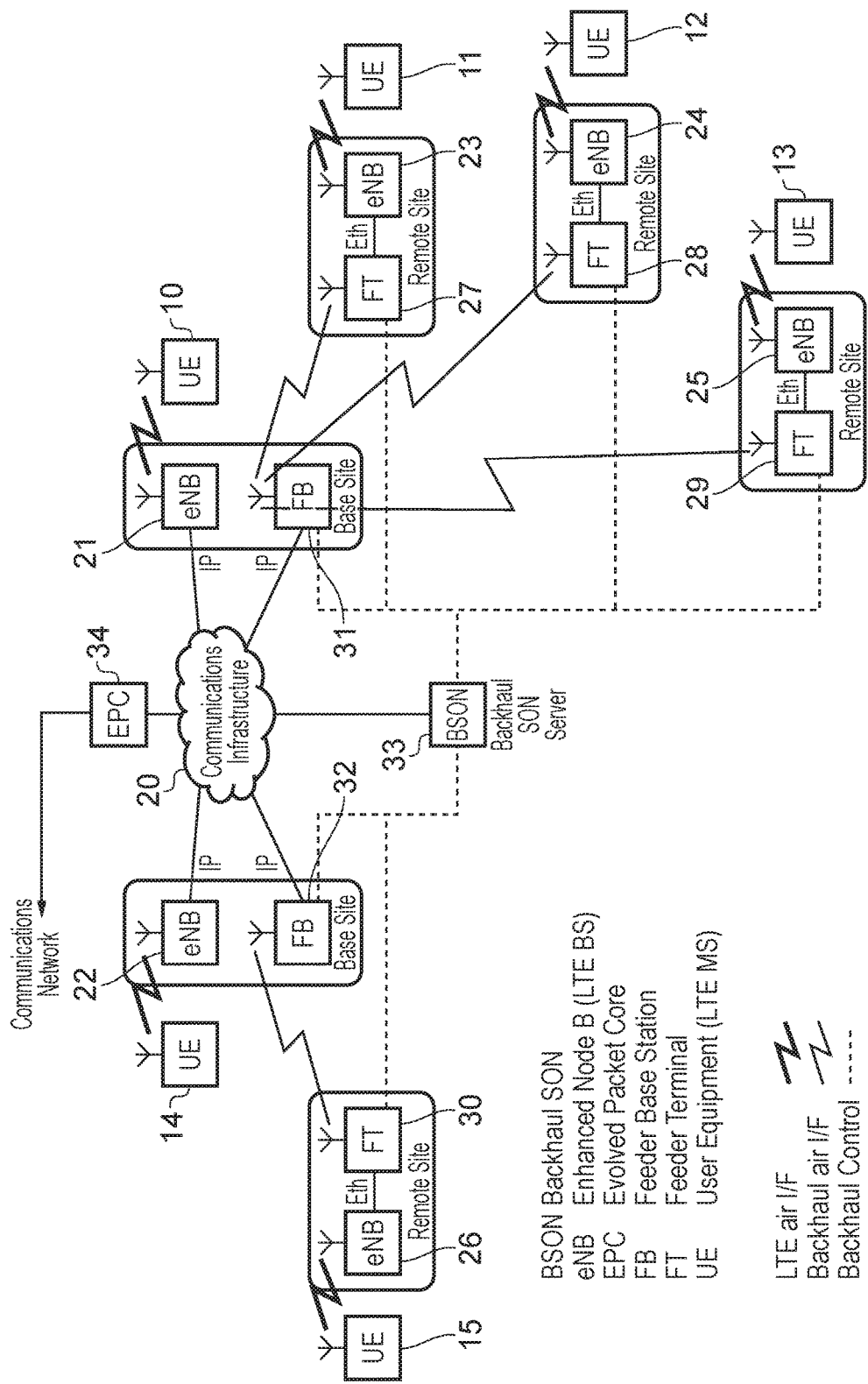
FIG. 1 schematically illustrates a communications network providing connectivity for end user equipment which employs a wireless backhaul network in which antenna apparatuses of some embodiments may be deployed to provide backhaul nodes.

Some particular embodiments are now described with reference to the figures. FIG. 1 schematically illustrates a multi-component network which provides connectivity for user equipment (UE) to a communications network such as the internet. The items of user equipment 10-15 of this example communicate wirelessly with LTE base stations—enhanced node B's (eNBs). Note that the LTE air interface represented in FIG. 1 is only an example and the present techniques are equally applicable to other suitable non-LTE air interfaces. Also, whilst for simplicity each access base station is shown as communicating with a single item of end user equipment, it will be appreciated that in practice such access base stations form point-to-multipoint devices enabling a plurality of items of end-user equipment to communicate with an individual access base station. These eNB access stations then either have a direct wired connection (via IP protocol) with the communications infrastructure 20 in the case of 21 and 22, or are connected to an associated feeder terminal (FT) in the case of eNBs 23-26. Each FT is in wireless communication with a feeder base (FB), shown as 31 and 32 in this figure. These FBs are then provided with a wired connection (via IP protocol) to the communications infrastructure 20. However, it should be noted that the FBs can also be coupled to the communications infrastructure via a further level of wireless backhaul network.

Also shown in FIG. 1 is a backhaul self-organising network (BSON) server (controller) 33, which is shown to be in communication via the dashed line labelled "backhaul control" with the FTs and FBs of the wireless backhaul network. It should be appreciated that this connection shown is logical and in fact will typically be provided via the wired connection to the communications infrastructure and the wired and/or wireless connection discussed above leading to these FBs and FTs. The communications infrastructure 20 is connected to a communications network (e.g. the internet) via the evolved packet core (EPC) 34. In the particular example of the wireless backhaul network shown in FIG. 1, the nodes (FBs and FTs) are intended to support the provision of relatively small cells, to be easily and rapidly deployable, to operate well in an unlicensed region frequency band, such that they must be able to cope with co-channel and adjacent channel interference from unsolicited and uncoordinated wireless sources and furthermore be adaptable when the conditions in which they are operating change.

Figure 2:
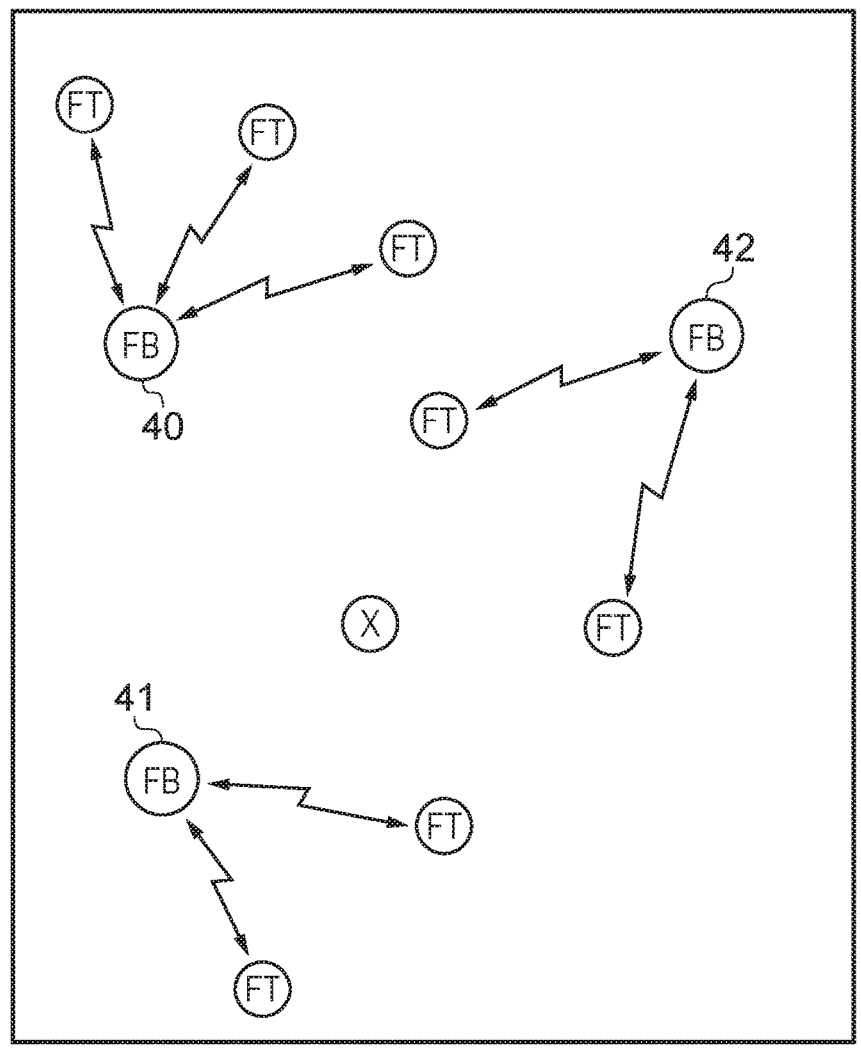
FIG. 2 schematically illustrates a number of feeder bases and feeder terminals in a wireless backhaul network and a source of external interference.

In FIG. 2, seven FTs and three FBs are shown, as well as a source of external interference "X". Accordingly, in order to provide good throughput in this wireless backhaul network, each node (FT and FB) of the wireless backhaul network is configurable in order to provide a high spectral efficiency. The wireless communication paths shown in FIG. 2 correspond generally to the line of sight (LOS) path between a FB and a FT, and therefore it is advantageous if the antenna provided for each FT and FB can be orientated to provide a strong beam in the direction of its communication partner and to suppress interference from other sources. For example, taking FB 40 as an example, it can be seen that if the directionality of its antenna is approximately aligned with the middle FT with which it communicates, but has a sufficiently broad beam width, then good communication throughput with its associated FTs can be achieved without significant interference from the other items in the figure arising. Similarly, the FB 41 can achieve the same by being orientated in a direction lying approximately between the two FTs with which it communicates, and having a beam width with sufficient width to accommodate both of the line of sight directions to each of its communication partners. However, in both examples (FB 40 and FB 41), this may further depend on the strength of the external source "X", and if this is sufficiently strong in their direction the directional orientation of FB 40 and the FB 41 may be better turned slightly away from the source "X" to reduce the interference which it generates. This is potentially a more significant problem for the FB 42, since the external interference source lies between the line of sight directions to its two communications partners. Accordingly, FB 42 may need to be generally orientated in the direction of the external interference source "X" but a beam pattern may be best selected which has a strong null in its central direction, but with reasonably strong lobes in the direction of its communication partner FTs in order to maximise the signal to noise ratio which it can achieve.

Figure 3:
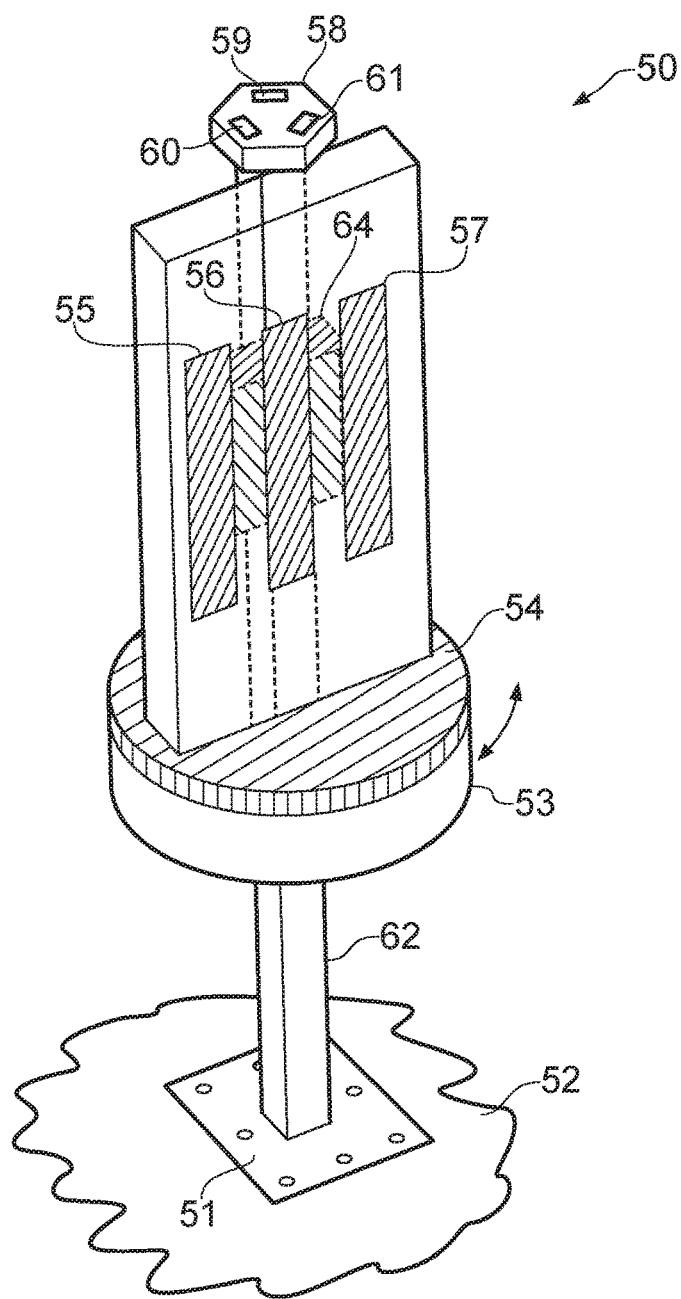
FIG. 3 schematically illustrates an antenna apparatus in one embodiment.

FIG. 3 schematically illustrates the general configuration of an antenna apparatus according to the present techniques, in one embodiment. The antenna 50 has a base plate 51 which enables the antenna to be fixably mounted with respect to its physical location 52. The base plate 51 and the physical location 52 shown are just one example, where in FIG. 3 the physical location 52 is essentially a flat surface, but it should be appreciated that the fixing of the antenna can be provided in a variety of ways, in dependence of the style of configuration which is desired and the type of physical location to which the antenna should be attached. For example, where the antenna should typically be connected to a vertical component such as to the side of a building, street furniture, and so on, a simple mounting bracket directly provided on the side of the base portion 53 may be more appropriate. The base portion 53 remains fixed whilst the rotating portion 54 is able to rotate through ±200° (i.e. in total through 400°), by means of a motor within the base portion 53 (not visible in this figure) which causes the rotating portion 54 to be rotated and held at a particular position with respect to the base portion 53. The example antenna 50 has a directional antenna formed of three antenna array components 55, 56 and 57, which can be seen in FIG. 3 to be elongate columns. Also visible in FIG. 3 is a circular antenna array 58 formed of 3 antenna components 59, 60 and 61. This is mounted atop the vertical column 62 which runs from the base plate 51 through the antenna apparatus 50, such that the circular antenna is fixed with respect to the physical location 52 of the antenna apparatus, but this need not be the case and other embodiments are conceivable in which the circular antenna is mounted on top of the directional array, so that it rotates therewith. Partially shown in FIG. 3 are the control electronics 64 which are situated behind the directional array, and these couple the antenna array components 55-57 and the circular array components 59-61 via read-out chains to a transceiver (also not shown). The control electronics 64 also comprise circuitry which can process the wireless signals received from the circular antenna array 58 in order to discover and characterise other sources of wireless signals in the environment of the antenna apparatus 50, whether these are other antenna apparatuses of the same wireless network or external interference sources.

The arrangement wherein the control electronics and read-out chains are physically closely located to the antenna array components means that, despite the rotational capability of the antenna apparatus, good signal fidelity is nevertheless maintained. Only a limited number of signals need be transferred from the rotating read-out chain electronics 64 across the rotating interface to the fixed portion 53. It should be appreciated that the antenna apparatus 50 will typically also be provided with a radome cover to protect its components, but this has been removed in the illustration of FIG. 3 for clarity of illustration purposes only.

Figure 4:
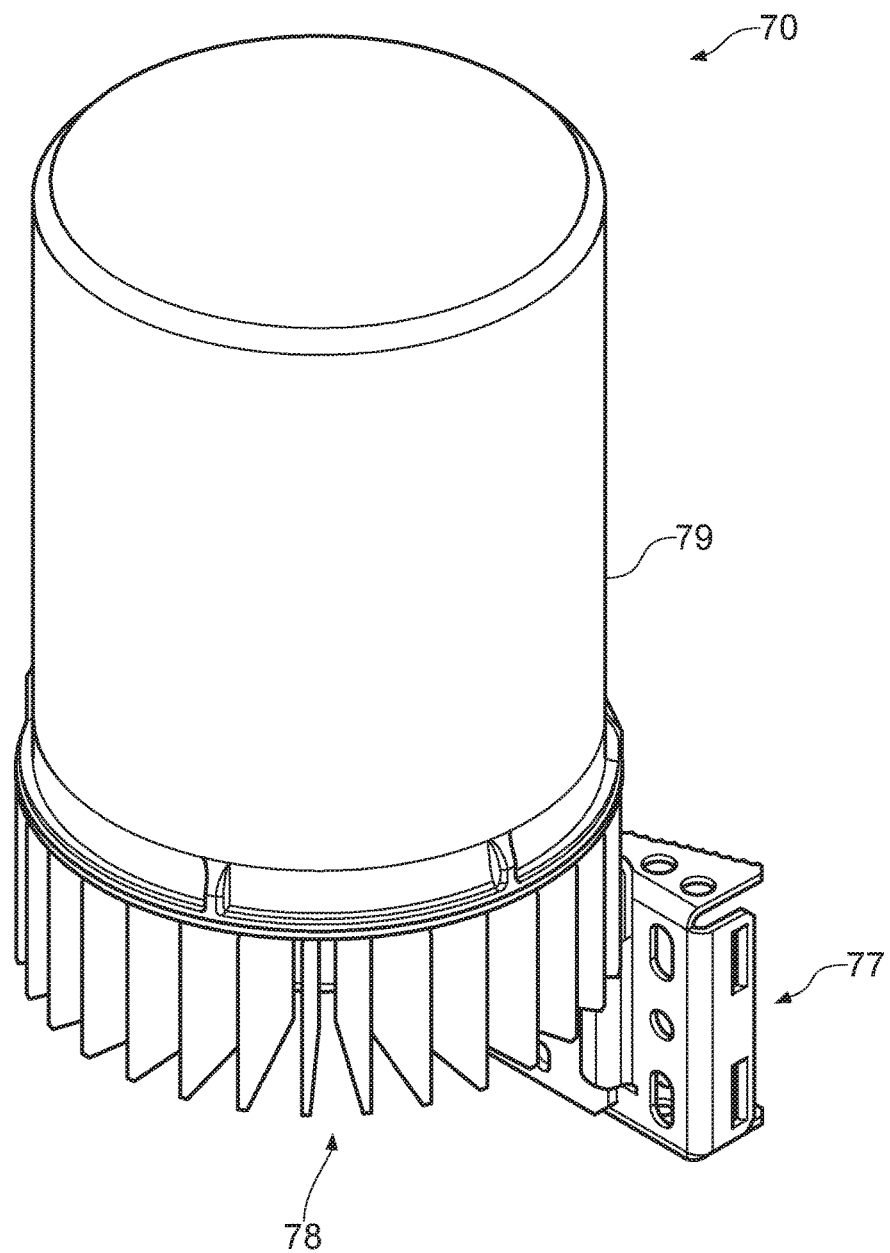
FIG. 4 schematically illustrates an antenna apparatus in one embodiment.
Figure 5:
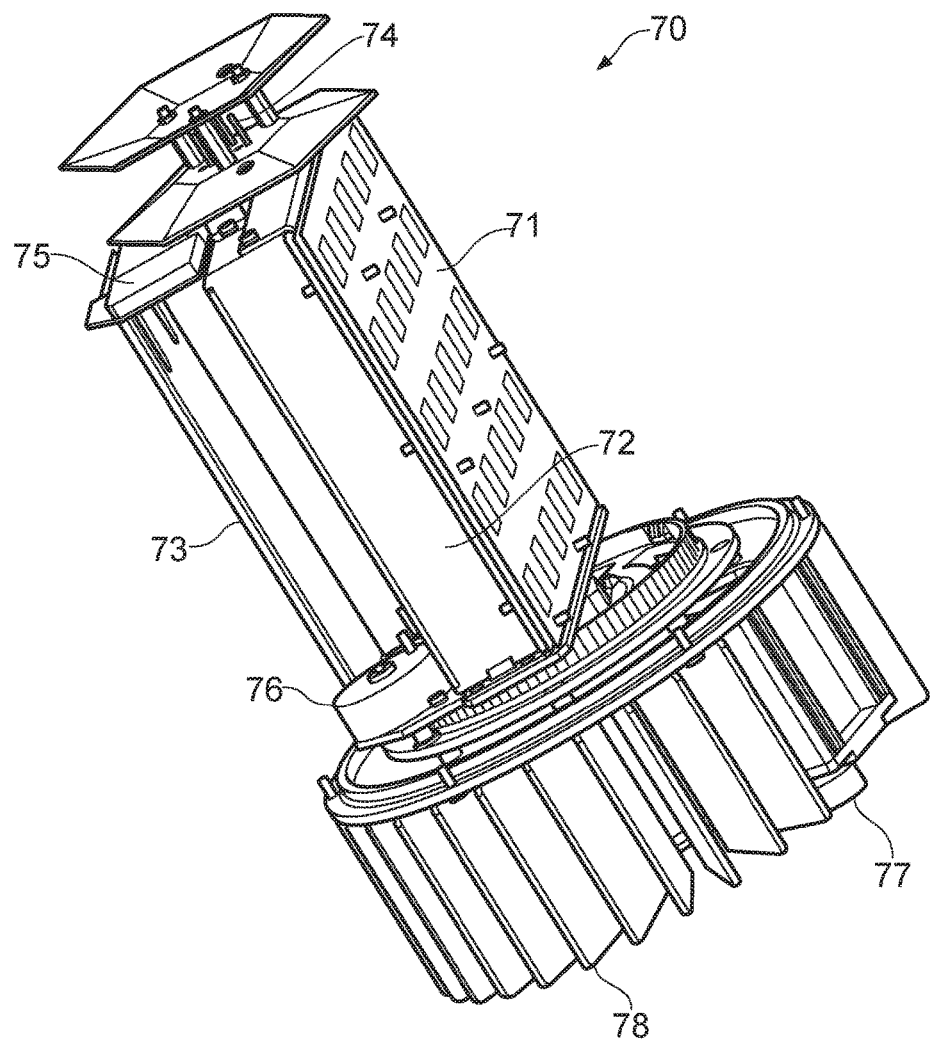
FIG. 5 schematically illustrates the antenna apparatus shown in FIG. 4 with its radome cover removed.

FIGS. 4 and 5 schematically illustrate in more detail the components of an antenna apparatus 70 in one embodiment. The radome cover 79 shown in FIG. 4 is removed in FIG. 5. In this embodiment, the directional antenna 71 can be seen to comprise 25 antenna array components arranged in a 5×5 grid. RF and base band electronics (i.e. essentially the read-out chains) and other control circuitry 72 are provided behind the main directional antenna assembly. These are not directly visible in the illustration of FIG. 5 due to the casing. The antenna 70 further comprises a rear-firing antenna 73 which is orientated in the opposite direction to the front firing main antenna 71. Although not visible in FIG. 5, the rear firing antenna 73 comprises a single column of antenna array elements forming a single antenna array component, which is physically very similar to a single column within the 5×5 array of antenna array elements of the front antenna 71. A circular antenna 74 is mounted on top of the front-firing main antenna 71 and is configured as a triple-monopole antenna which is used, as described above, when assessing the environment in which the antenna 70 finds itself. A further GPS antenna 75 is also provided in the antenna apparatus 70, which is used for node location, orientation and precise time synchronisation. A motorised steering mechanism 76 enables the antenna apparatus to be orientated in any direction in azimuth, and a gigabit Ethernet network interface 77 is provided to connect the antenna further. The fins 78 are for heat dissipation. Note also that the RF/base band electronics and control circuitry 72 mounted behind the front firing main antenna 71 are also connected to the circular antenna 74 and the rear firing antenna 73, as will be discussed in more detail below.

Figure 6:
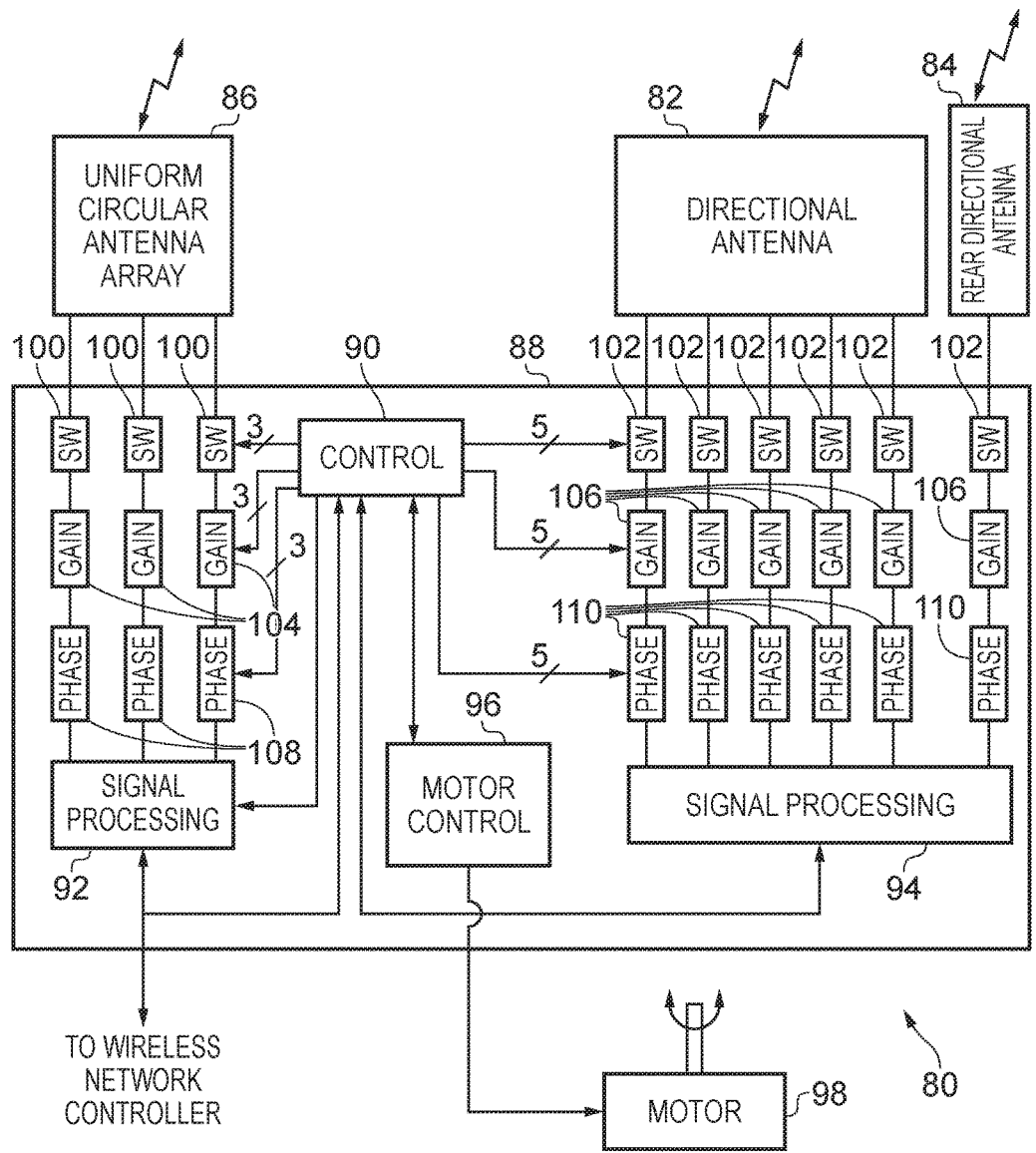
FIG. 6 schematically illustrates the control electronics of an antenna apparatus in one embodiment.

FIG. 6 schematically illustrates an antenna apparatus 80 in one embodiment. As illustrated in the figure the antenna apparatus 80 can be seen to comprise a directional antenna 82, a rear directional antenna 84, and a uniform circular antenna array 86. The individual antenna components of these three different types of antenna are connected to read-out chains which are shown in FIG. 6 as forming part of the control circuitry 88. The control circuitry 88 comprises control device 90 which, in particular, configures the components of the read-out chains, controls the operation of two signal processing devices 92 and 94, and controls the operation of the motor control device 96. The motor control device 96 controls the motor 98 which can cause the rotatable part of the antenna apparatus to be rotatably positioned with respect to a fixed non-rotatable part of the antenna apparatus by which the antenna apparatus is fixed with respect to its physical location.

Considering first the configuration of the antennas of the antenna apparatus, the control circuitry 90 determines the settings of the set of switches 100, the gain circuitry 104, and the phase circuitry 108 in the read-out chains for the uniform circular antenna array 86. Similarly the control circuitry 90 determines the settings of the set of switches 102, the gain circuitry 106, and the phase circuitry 110 in the read-out chains of the directional antenna 82 and rear directional antenna 84. Although not explicitly shown in the illustration of FIG. 6, the present techniques also provide that at least some of the components of the read-out chains for the antennas may be shared, for example amongst the phase circuitry 108 and 110. Phase shifters can be costly and large, and such sharing therefore enables the antenna apparatus to be provided in a cost-effective and physically compact manner.

Thus, when the antenna apparatus is listening to its environment by means of the uniform circular antenna array 86 and the read-out chains 100, 104, 108, the signal processing circuitry 92 (comprising a transceiver) processes the signals in order to determine signal strength information and direction information for the signals received. More detail of the signal processing chain 92 is given in FIG. 7 and described below. The signal strength information and direction information determined by processing the signals can then be stored in the control device 90, for example so that this information can be gathered into a single bundled transmission to a wireless network controller during an expected non-busy period for the network, such as at 3 am. However, under control of the control circuitry 90, the signal processing device 92 is also able to directly communicate this signal strength information and direction information to the wireless network controller, essentially as soon as it has been determined.

As mentioned above, the antenna apparatus may be instructed to participate in either an active or a passive sounding schedule, the control over such sounding schedules being provided by the wireless network controller, as is described in more detail below with reference to FIG. 7. When the antenna apparatus participates in a passive sounding schedule, only its uniform circular antenna array is active (in reception mode), so that the antenna apparatus can gather information relating to other sources of wireless signals in its environment. When the antenna apparatus participates in an active sounding schedule, it can make use of any of its uniform circular antenna array 86, its directional antenna 82 and its rear directional antenna 84 in order to transmit a predetermined characteristic signal, which other antenna apparatuses in the wireless network will listen for in order to be able to characterise the signal strength and direction which they receive from this antenna apparatus. However, the present techniques further recognise that it is preferable for the antenna apparatus only to make use of its uniform circular antenna array 86 when actively transmitting as part of the sounding schedule, such that an isotropic radiation pattern can be generated, and thus other antenna apparatus are equally able to listen to the active transmission from this antenna apparatus, regardless of their direction. Moreover this also provides that a known transmission power from the uniform circular antenna array 86 can more easily be compared with the received signal strength at another antenna apparatus, such that the path loss between the two can be quantified.

The signal processing circuitry 92 and control circuitry 90 may independently determine an azimuthal position for the antenna apparatus on the basis of signal strength and direction information calculated within the antenna apparatus, but a better coordination of the multiple antenna apparatuses of the wireless network is provided if the azimuthal position for the antenna apparatus is determined by a wireless network controller which receives signal strength direction information from those multiple antenna apparatuses. Whatever the source of the determined azimuthal position, this is implemented by the motor control circuitry 96 controlling the motor 98.

Moreover, as well as the azimuthal position determined for the antenna apparatus, a beam pattern configuration for use during data communication for the antenna apparatus can also be determined and the control circuitry 90 can then configure any of the directional antenna 82, the rear directional antenna 84 and the uniform circular antenna array 86 in order to implement that beam pattern configuration, by appropriate setting of the switches 100, 102, the gain circuitry 104, 106 and the phase circuitry 108, 110. At least some of the switches 100, 102, the gain circuitry 104, 106 and the phase circuitry 108, 110 may be shared between the antenna (front, rear and circular) components, enabling a reduced size of read-out electronics and cost thereof, in particular when phase shifting circuitry is shared, such that not only is an antenna apparatus which is cheaper is provided, but also one in which the readout electronics can be easily comprised within the portion of the antenna which rotates, and thus in close proximity to the antenna array components, thus improving signal fidelity, yet also allowing the rotation of the directional antennas.

Figure 7:
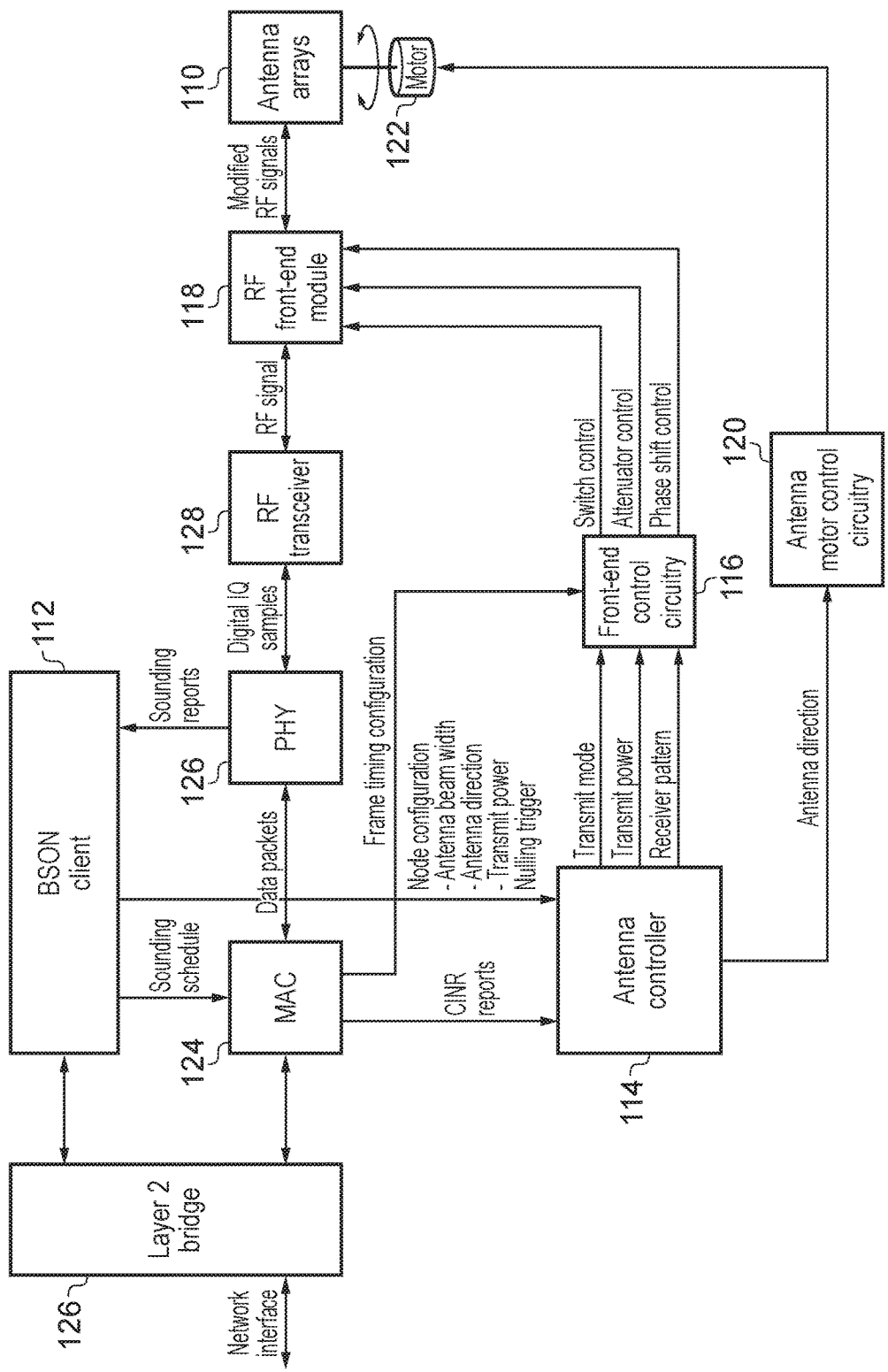
FIG. 7 schematically illustrates circuitry connected to the antenna arrays of one embodiment, both within the antenna apparatus itself and in other network components to which the antenna apparatus is connected.

FIG. 7 schematically illustrates the connections of the antenna arrays (front, rear and circular) 110 in one embodiment. The antenna arrays 110 are controlled by some of the other components shown in FIG. 7. A backhaul self-organising network (BSON) client (controller device) 112 (not itself part of the antenna apparatus, but rather forming a separate wireless network controller) provides a node (antenna) configuration including antenna beam width and direction, transmit power and a nulling trigger to an antenna controller 114. However, additionally the antenna controller 114 may autonomously select a receiver pattern which maximises throughput based on carrier to interface and noise ratio (CINR) measurements. The antenna controller 114 controls the antenna arrays by passing configuration information for the transmit mode, the transmit power and the receiver pattern to the front end circuitry 116. The front end control circuitry 116 converts these into the required switch control signals, attenuator (gain) control signals and phase shift control signals which are passed to the RF front end module 118. The RF front end module 118 represents the component of FIG. 7 in which the switch, gain and phase components of FIG. 6 are to be found. The antenna controller 114 also indicates an antenna direction to the antenna motor control circuitry 120, which controls the motor 122 in order to orientate the antenna arrays 110 in azimuth. A modem data path is provided comprising the MAC 124, the PHY 126 and the RF transceiver 128, which then couples to the RF front-end module 118 in order to provide this with the RF signals which the read-out chains modify before passing them to the antenna arrays 110. In other words, data packets are sent between the MAC 124 and the PHY 126, digital IQ samples are passed between the PHY 126 and the RF transceiver 128, and RF signals are exchanged between the RF transceiver 128 and the RF front end module 118. The BSON client 112 (BSON controller device), also referred to as a wireless network controller herein, also generates sounding schedules to be implemented by the antenna apparatus which are received by the MAC 124. The MAC 124, like the BSON client 112, communicates with a layer 2 bridge 126 which is coupled to the network interface. The BSON controller 112 coordinates the operation of the antenna apparatus with the operation of other antenna apparatuses in the wireless network when a sounding procedure (whether active or passive) is to be carried out), and the configuration of a given sounding procedure is received by the MAC 124. Results of the sounding procedure for this antenna apparatus, in the form of a sounding report, are returned to the BSON controller 112, from the PHY 126.

Figure 8:
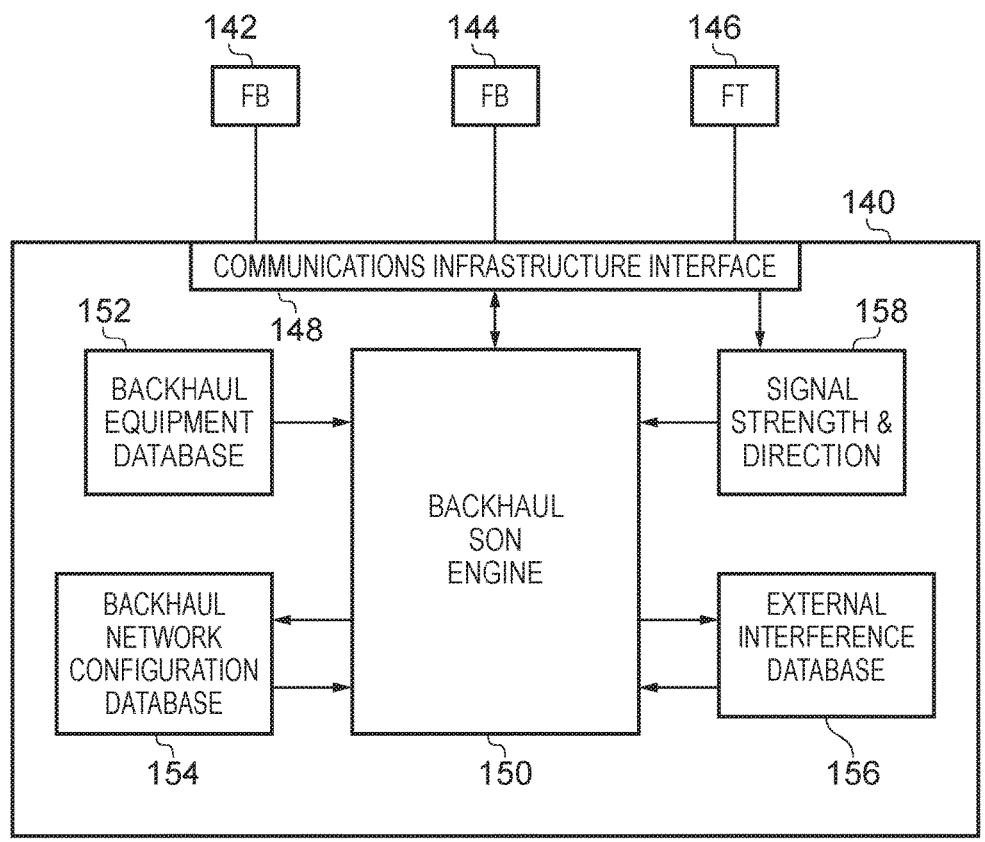
FIG. 8 schematically illustrates a wireless network controller in one embodiment providing a backhaul self-organising network controller.

FIG. 8 schematically illustrates a wireless network controller 140 in one embodiment. The wireless network controller 140 is shown in FIG. 8 as being communication with two feeder bases 142 and 144, and with a feeder terminal 146. It will be understood however, for example with reference to FIG. 1, that the wireless network controller 140 will typically be in communication with (and in control of) more feeder bases and figure terminals than this, and the example of FIG. 8 merely illustrates the principle. Conversely, note that in a given full wireless network more than one wireless network controller may be provided, with a group of feeder bases and figure terminals, for example grouped together by geographical location, under the control of a given wireless network controller. The wireless network controller 140 in FIG. 8 comprises a communications infrastructure interface 148 by which it communicates (via a communications infrastructure 20—see FIG. 1) with the feeder bases and terminals. The main processing component of the wireless network controller 140 is the backhaul self-organising network (BSON) engine 150, and the wireless network controller 140 further comprises a backhaul equipment database 152, a backhaul network configuration database 154, an external interference database 156 and a signal strength and direction storage 158. The backhaul equipment database 152 is used by the wireless network controller to store information relating to the geographical location of each of the antenna apparatuses under its control, as well as their particular individual capabilities. This information for a given antenna apparatus is populated in the database when that antenna apparatus is first deployed. The backhaul network configuration database 154 stores configuration information for the antenna apparatuses, such as antenna beam pattern information, antenna bearing information, transmission power, and time-frequency resource allocation. The external interference database 156 is used by the BSON engine 150 to store characterisations of external interference sources which it has detected and characterised, for example in terms of geographical location, antenna beam pattern, antenna bearing, transmission power (e.g. equivalent isotropic radiated power—EIRP), time-frequency resource allocation and other time characteristics (such as an observed time pattern of an external interference source— continuous, intermittent, only between certain hours, etc.). The BSON engine 150 instructs the antenna apparatuses under its control to participate in a passive sounding procedure (when the antenna apparatuses the wireless network all listen and none transmit) so that external interference sources can be detected and characterised on the basis of signal strength and direction information which each generates and forwards to the wireless network controller 140. This signal strength and direction information received from the feeder bases and feeder terminals 142, 144, 146 is temporarily stored in the signal strength and direction storage 158 for processing by the BSON engine 150. The result of the external interference source characterisation is stored in the external interference database 156. The BSON engine 150 can also instruct the antenna apparatuses under its control to participate in an active sounding procedure (when only one of the antenna apparatuses transmits a known signal and other antenna apparatuses in the wireless network listen for that signal) so that in particular the path loss from one node to another can be calculated. Node-to-node path losses can also be stored in the backhaul network configuration database 154.

Figure 9:
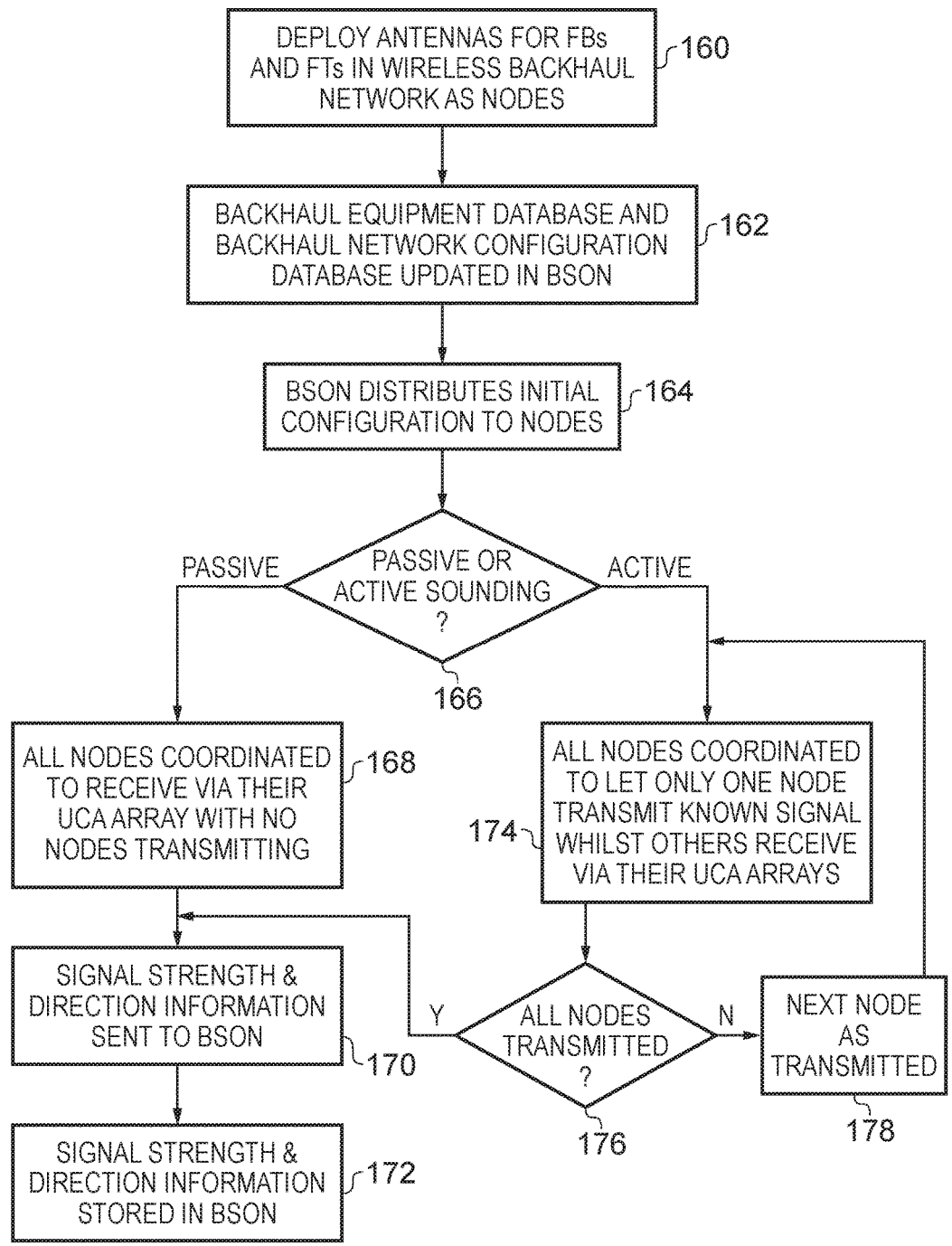
FIG. 9 shows a sequence of steps which are carried out in the method of one embodiment in order to carry out active or passive sounding for antenna apparatuses in a wireless network to monitor and characterise their environment.

FIG. 9 shows a sequence of steps which are taken in the operation of a wireless network controller such as the wireless network controller 140 shown in FIG. 8. The flow begins at step 160, where a number of antennas to be used as feeder bases and feeder terminals are deployed to form the nodes of a wireless backhaul network. The backhaul equipment database and backhaul network configuration database within the wireless network controller (BSON) are updated at step 162 for each deployed antenna apparatus. At step 164 the wireless network controller distributes an initial configuration to each node (antenna apparatus), based for example on the geographical location of each node and its intended role in the backhaul network (e.g. as a feeder base or a feeder terminal). The wireless network controller then controls the antenna apparatuses the wireless network to participate in either a passive sounding procedure or an active sounding procedure. If a passive sounding procedure is to be carried out then from step 166 the flow proceeds to step 168 where all nodes are coordinated to only operate in reception mode and furthermore to each listen using their uniform circular antenna arrays to their environment. On the basis of this isotropic signal reception each antenna apparatus determines signal strength and direction information of any external interference sources which it observes and forwards this information to the wireless network controller (BSON) at step 170. The signal strength and direction information is stored in the wireless network controller (BSON) at step 172. Alternatively, if an active sounding procedure is to be carried out then from step 166 the flow proceeds to step 174 where the nodes are coordinated, such that all but one node operate in their reception mode and listen using their uniform circular antenna arrays to their environment, whilst a single node transmits a known unique sounding signal, such that the signal strength and direction information determined by the other nodes can be uniquely associated with the single transmitting node. Via steps 176 and 178, each node in turn takes the role of single transmitting node, until all nodes have transmitted and have been listened for by the other nodes. It should be appreciated that "all nodes" here does not mean that it is essential for strictly all nodes in the whole network to participate, and the wireless network controller may administer sounding procedures in which only a subset of the nodes participate, for example because of geographical limitation (i.e. because two nodes in the network are known to be so remote from one another that there is no need for them to participate in the same sounding procedure). On the basis of the isotropic signal reception at each iteration each participating antenna apparatus determines signal strength and direction information for the transmitting node of that iteration, and forwards this information to the wireless network controller (BSON) at step 170. The signal strength and direction information is stored in the wireless network controller (BSON) at step 172.

Figure 10:
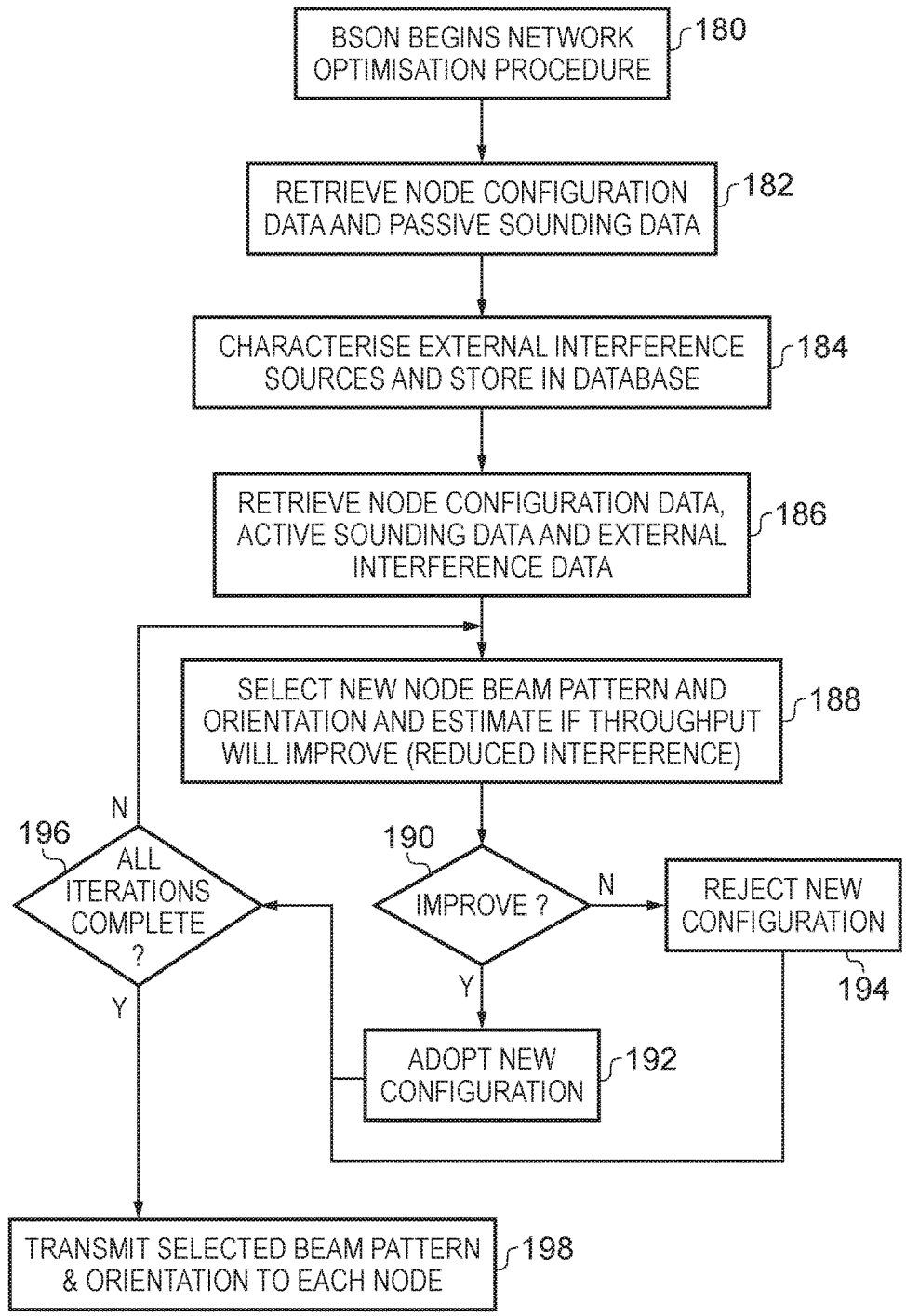
FIG. 10 shows a sequence of steps which are carried out in the method of one embodiment in which a wireless network controller performs a network configuration improvement procedure on the basis of sounding information received from antenna apparatuses in the wireless network.

On the basis of the active and passive sounding data thus gathered, the wireless network controller can then characterise external interference sources in the locality, determine the path loss between nodes of the backhaul network, and determine a beam pattern and azimuthal orientation for each antenna apparatus in the network which is under its control. FIG. 10 shows a sequence of steps which are carried out in the wireless network controller when this process is followed. The flow begins at step 180 where the network optimisation procedure starts. At step 182 the wireless network controller retrieves node configuration data (from the backhaul equipment database 152 and the backhaul network configuration database 154) and passive sounding data (from the signal strength and direction storage 158), and at step 184 characterises the external interference sources which are observed in the network and stores this information in the external interference database 156 at step 186. The iterative steps of the procedure are represented by steps 188-196, where the wireless network controller simulates the operation of the wireless backhaul network, varying the operational configuration of each node (in particular its beam pattern and azimuthal orientation) to seek to improve the overall throughput of the network. Step 188 of this iterative procedure comprises selecting a new beam pattern and/or orientation, and determining if this will improve the network throughput (for example by reducing interference). Iterations which improve the network throughput are adopted (steps 190 and 192), whilst iterations which do not are rejected (steps 190 and 194). Once all iterations are determined to have been completed at step 196 then the flow proceeds to step 198 where the wireless network controller transmits the selected beam pattern and orientation determined for each node of the network to that node.

Figure 11:
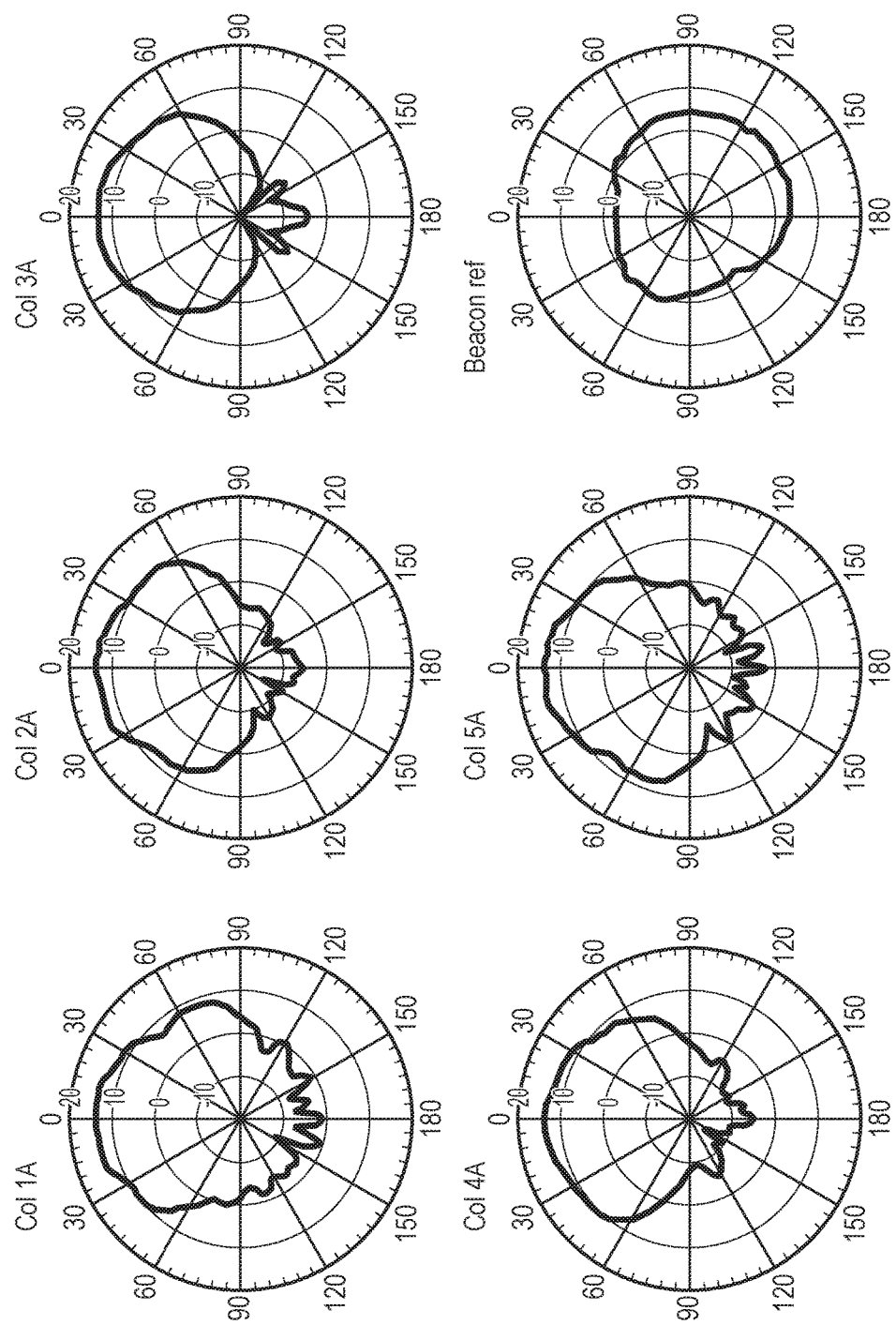
FIG. 11 shows a subset of the beam patterns which are available to an antenna apparatus in one embodiment.
Figure 11:
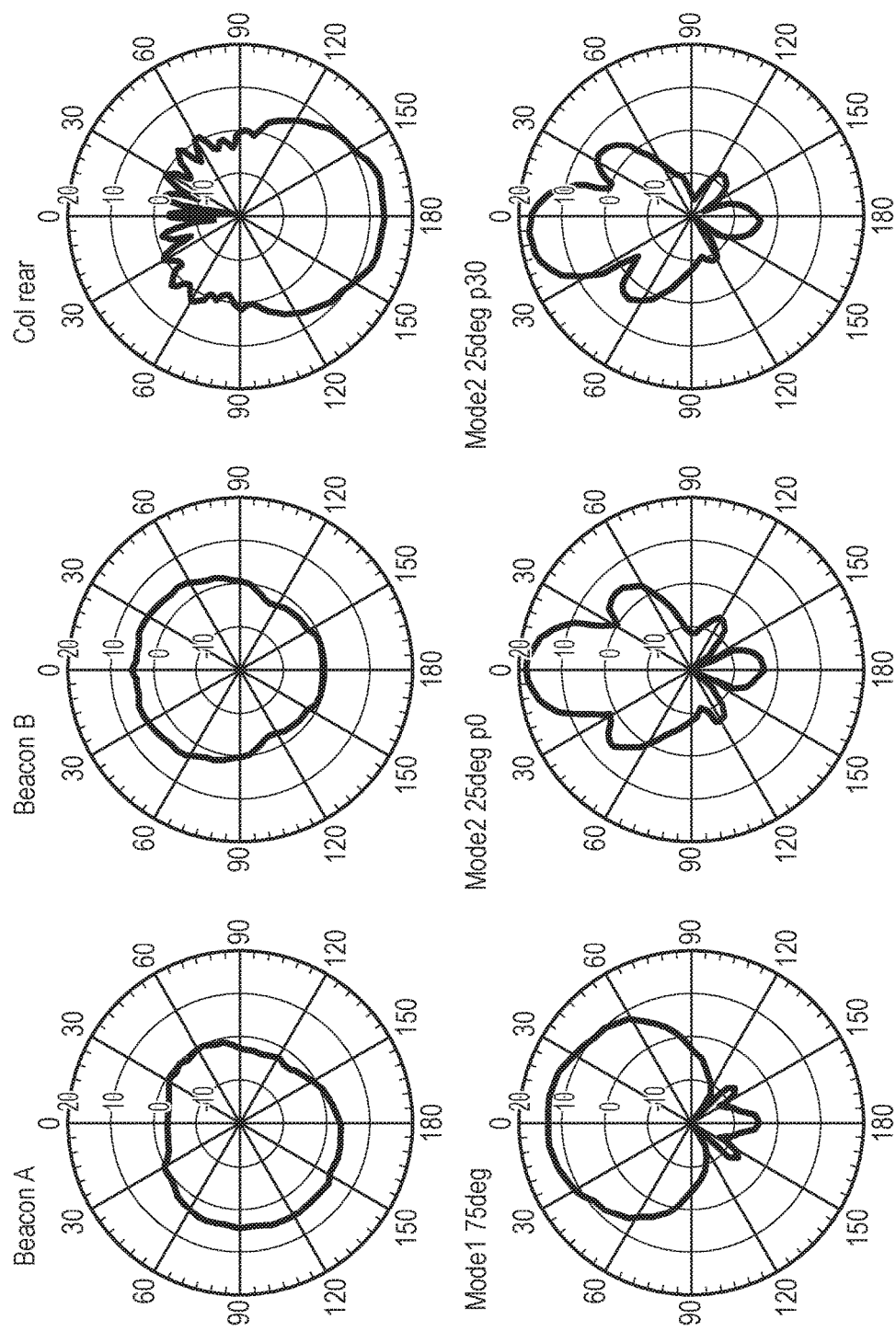
Figure 11:
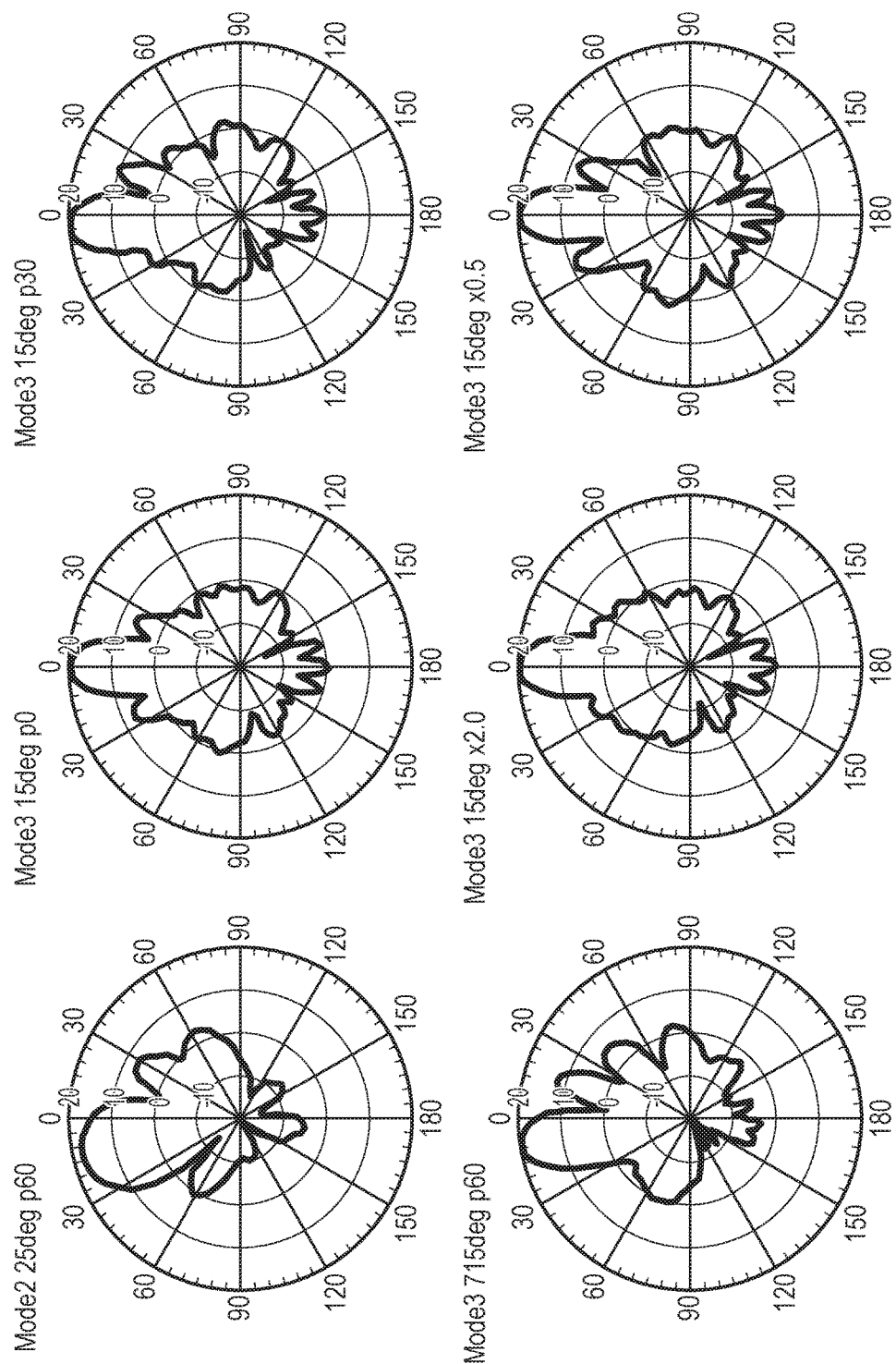
Figure 11:
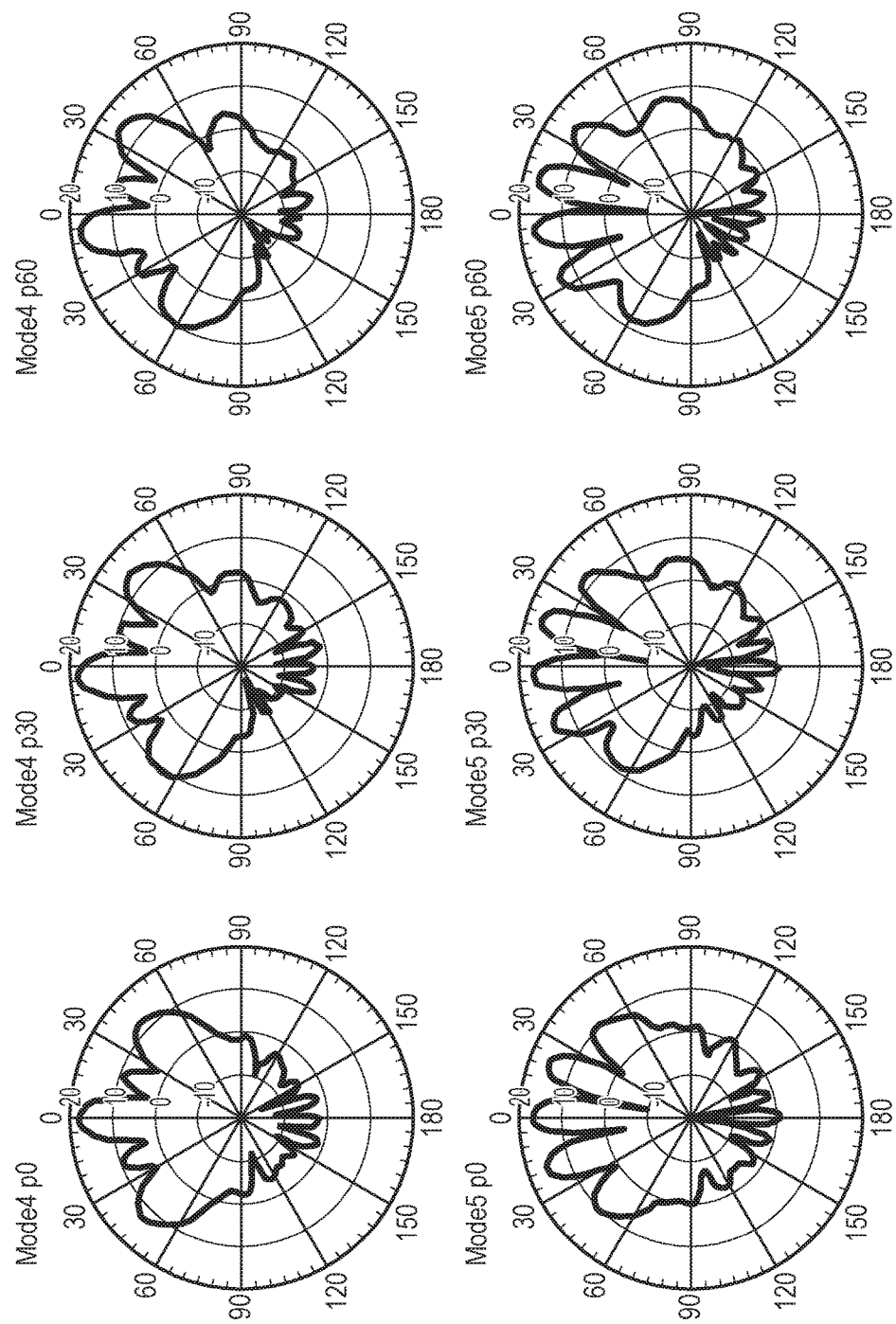
Figure 11:
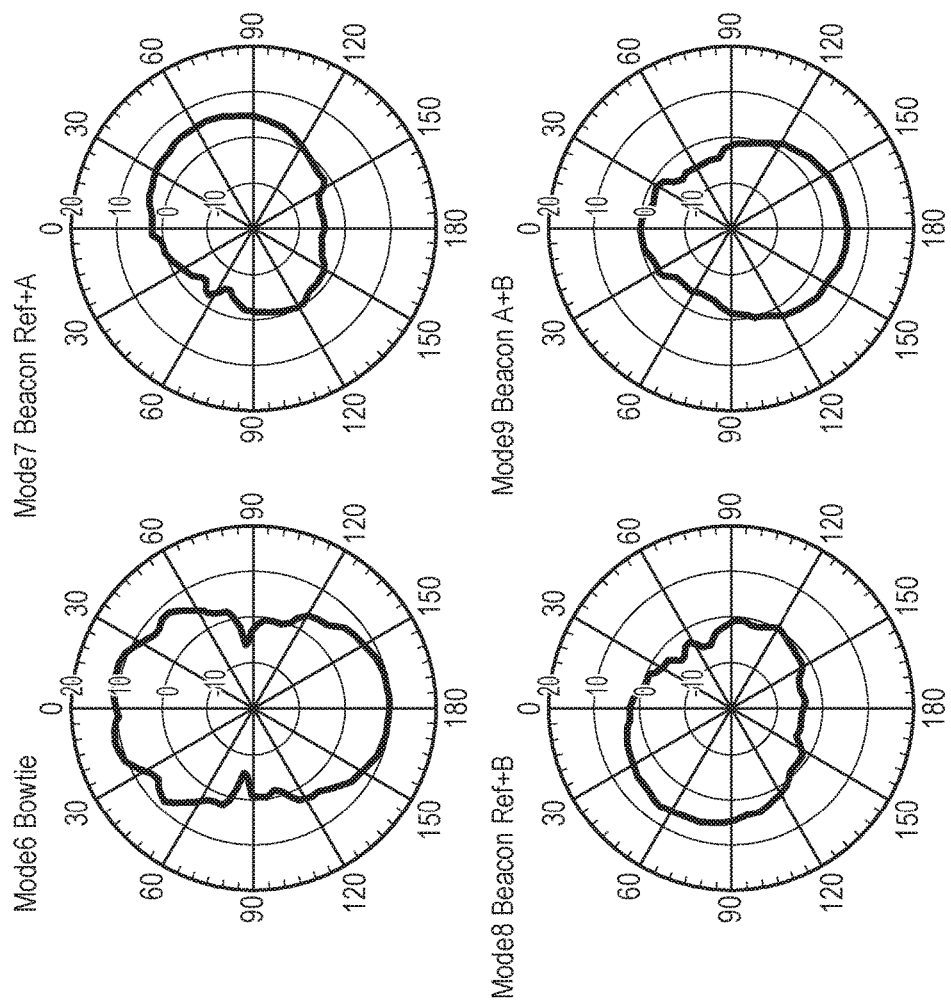

FIG. 11 shows a subset of the beam patterns which can be generated by an antenna apparatus such as is illustrated in FIGS. 3-7, showing the useful range of beam patterns available. In FIG. 11 the following classes of beam patterns can be identified:

Narrow beams with a single main lobe and of various beam widths, where side lobes are significantly reduced relative to the main lobe;

Electronically steered beams that combine signals at RF, enabling antenna directivity to the left or right of the boresight of the array;

Beams with grating lobes, where the array pattern has equally strong peaks in multiple directions and deep nulls with significant attenuation in other directions; and A bowtie configuration.

Combined with the above discussed rotating mechanism, the antenna apparatus thus provided, using a fixed set of beam patterns, improves over traditional uniform linear arrays, by being able to maintain a peak gain in any direction. For uniform linear arrays, it is known that the array gain decreases as the angle from the bore sight increases. In addition, the antenna apparatus provided is economically more attractive than more complex circular arrays. For example, ten complete transceiver chains with an aperture of $6.08\lambda$ would generate an antenna pattern with $25°$ beam width. Embodiments of the antenna apparatus described herein have an aperture which is $4\lambda$ and use only two transceiver chains (note that the read-out chains shown in FIG. 7 reduce down to two connections in the receiver direction and two connections in the transmitter direction) and the narrowest beam that can be generated is $15°$. Overall therefore the antenna apparatus provided by the present techniques enables the maximum gain to be orientated in any direction in $360°$, whilst improving diversity reception and conversely interference nulling from any direction using a rich set of multiple transmitter and receiver beams.

Figure 12:
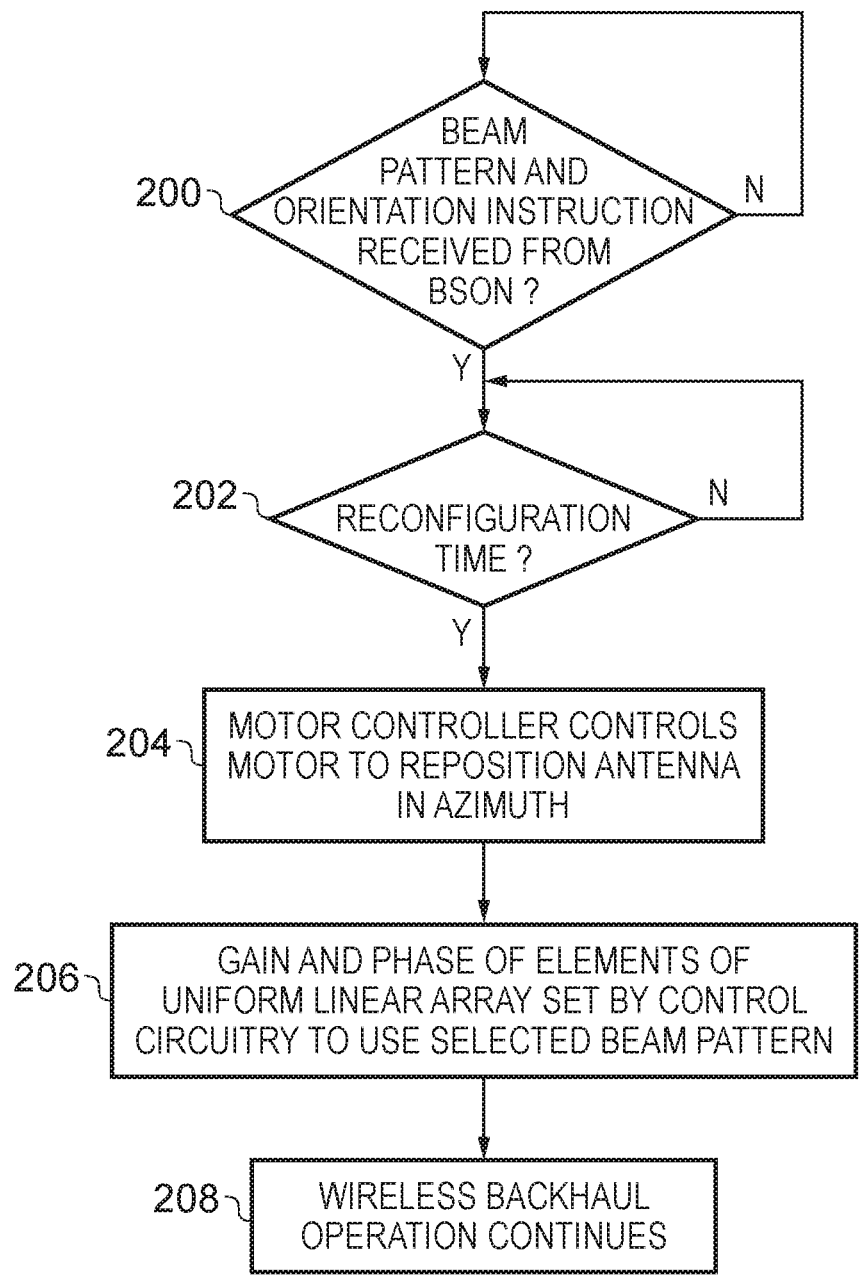
FIG. 12 shows a sequence of steps which are taken when operating an antenna apparatus in one embodiment.

FIG. 12 shows a sequence of steps which are carried out in an antenna apparatus of one embodiment in order to reconfigure itself under the control of a wireless network controller. As an ongoing process represented by step 200, the antenna apparatus is continually capable of receiving new beam pattern and orientation information from the wireless network controller (BSON). When such new configuration information has been received by the antenna apparatus, but not yet implemented, the antenna apparatus determines at step 202 if it should now reconfigure itself. For example, whilst on the one hand the antenna apparatus could implement a new configuration as soon as it is received, step 202 on the other hand shows an embodiment in which the antenna apparatus waits until a predetermined time, when disruption to data throughput of the network caused by the brief reconfiguration operation is expected to be minimal. Once this predetermined time has been reached, at step 204 the motor controller controls the motor of the antenna apparatus to position it in azimuth as instructed by the wireless network controller, and at step 206 the gain and phase of the elements of the uniform linear arrays (front and rear) of the antenna apparatus are set by its control circuitry to use the beam pattern selected for this antenna apparatus by the wireless network controller. Thus configured, the regular operation (data transfer) of the wireless backhaul network continues at step 208.

In brief overall summary, an antenna apparatus for use in a wireless network and method of operating such an antenna apparatus are provided. Moreover a wireless network controller to provide a configuration of such an antenna apparatus, a method of operating such a wireless network controller, and a resulting wireless network are also provided. The antenna apparatus comprises a directional antenna and a uniform circular antenna array. The directional antenna can be rotatably positioned about an axis with respect to a fixed mounting portion of the apparatus in dependence on wireless signals received by the uniform circular antenna array. The uniform circular antenna array allows the antenna apparatus to receive wireless signals isotropically and thus to accurately monitor the wireless signal environment in which it finds itself. The antenna apparatus can thus monitor and characterise incoming signals, both from external interference sources and from other network nodes, and the directional antenna can then be positioned in rotation to improve the network throughput.

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function. "Configured to" does not imply that the apparatus element needs to be changed in any way in order to provide the defined operation.

Although illustrative embodiments have been described in detail herein with reference to the accompanying drawings, it is to be understood that the invention is not limited to those precise embodiments, and that various changes, additions and modifications can be effected therein by one skilled in the art without departing from the scope and spirit of the invention as defined by the appended claims. For example, various combinations of the features of the dependent claims could be made with the features of the independent claims without departing from the scope of the present invention.

We claim:

1. Antenna apparatus for communication via a wireless network comprising:
    a directional antenna, wherein the directional antenna is a uniform linear antenna array;
    linear array control circuitry for the uniform linear antenna array, wherein the linear array control circuitry comprises a set of switches for array elements of the uniform linear antenna array configured to control gain and phase of the array elements such that the uniform linear antenna array is operated with a selected beam pattern of a set of beam patterns, wherein the set of beam patterns provides a range of directionality and interference nulling;
    a uniform circular antenna array; and
    a mounting portion configured to be fixed relative to a physical location of the antenna apparatus,
    wherein the directional antenna is configured to be rotatably positioned about an axis with respect to the mounting portion, and the linear array control circuitry is configured for the selected beam pattern to be selected in dependence on wireless signals received by the uniform circular antenna array.

2. The antenna apparatus as claimed in claim 1, wherein the uniform circular antenna array comprises monitoring circuitry configured to generate signal strength information and direction information for the wireless signals received, and the directional antenna is configured to be rotatably positioned about the axis with respect to the mounting portion in dependence on the signal strength information and the direction information.

3. The antenna apparatus as claimed in claim 2, wherein the antenna apparatus is configured to send the signal strength information and the direction information to a wireless network controller, and is configured to position the directional antenna about the axis with respect to the mounting portion in accordance with a rotational positioning instruction received from the wireless network controller.

4. The antenna apparatus as claimed in claim 2, wherein the antenna apparatus is configured to determine a rotational position for the directional antenna in dependence on the signal strength information and the direction information, and is configured to position the directional antenna about the axis with respect to the mounting portion in accordance with the rotational position determined.

5. The antenna apparatus as claimed in claim 1,
    wherein the uniform circular antenna array is configured to transmit a predetermined characteristic signal, and
    the antenna apparatus is configured to coordinate its operation with respect to at least one other antenna apparatus so that the antenna apparatus and the at least one other antenna apparatus transmit the predetermined characteristic signal at mutually exclusive times.

6. The antenna apparatus as claimed in claim 1,
    wherein the antenna apparatus is configured to coordinate its operation with respect to at least one other antenna apparatus so that the antenna apparatus and the at least one other antenna apparatus receive the wireless signals by their respective uniform circular antenna arrays in a period when none of the antenna apparatus and the at least one other antenna apparatus are transmitting.

7. The antenna apparatus as claimed in claim 1, further comprising a motor arrangement to position the directional antenna in rotation about the axis with respect to the mounting portion.

8. The antenna apparatus as claimed in claim 1, wherein the directional antenna is rotatable through a full rotation about the axis with respect to the mounting portion.

9. The antenna apparatus as claimed in claim 1, wherein the uniform circular antenna array is fixedly mounted with respect to the directional antenna.

10. The antenna apparatus as claimed in claim 1, further comprising a rear directional antenna, wherein the rear directional antenna is fixedly mounted with respect to the directional antenna, and wherein the rear directional antenna is oriented in a substantially opposite direction to the directional antenna.

11. The antenna apparatus as claimed in claim 10, wherein the rear directional antenna is a rear uniform linear antenna array.

12. The antenna apparatus as claimed in claim 11, wherein the rear uniform linear antenna array comprises fewer array elements than the directional antenna.

13. The antenna apparatus as claimed in claim 1, wherein the antenna apparatus is configured to communicate with more than one other antenna apparatus in the wireless network concurrently.

14. The antenna apparatus as claimed in claim 1, wherein the antenna apparatus is configured to operate as a hub node in the wireless network.

15. The antenna apparatus as claimed in claim 1, wherein the antenna apparatus is configured to operate as a terminal node in the wireless network.

16. The antenna apparatus as claimed in claim 1, wherein the antenna apparatus is configured to operate as a backhaul node in the wireless network.

17. A method of operating an antenna apparatus for communication via a wireless network, wherein the antenna apparatus comprises a directional antenna, wherein the directional antenna is a uniform linear antenna array, a uniform circular antenna array, and a mounting portion configured to be fixed relative to a physical location of the antenna apparatus, the method comprising the steps of:
    receiving wireless signals via the uniform circular antenna array;
    positioning the directional antenna in rotation about an axis with respect to the mounting portion in dependence on the wireless signals received by the uniform circular antenna array; and
    controlling the uniform linear antenna array using linear array control circuitry comprising a set of switches, gain circuitry and phase circuitry for array elements of the uniform linear antenna array to control gain and phase of the array elements such that the uniform linear antenna array is operated with a beam pattern selected from a set of beam patterns, wherein the set of beam patterns provides a range of directionality and interference nulling, and wherein the beam pattern is selected in dependence on the wireless signals received by the uniform circular antenna array.

18. Antenna apparatus for communication via a wireless network comprising:
    means for directionally transmitting and receiving wireless signals, comprising a uniform linear antenna array;

means for transmitting and receiving wireless signals in a uniform circular manner;

means for mounting the means for directionally transmitting and receiving wireless signals fixedly relative to a physical location of the antenna apparatus;

means for positioning the uniform linear antenna array in rotation about an axis with respect to the means for mounting the antenna apparatus in dependence on the wireless signals received by the means for transmitting and receiving wireless signals in a uniform circular manner; and means for controlling the uniform linear antenna array comprising a set of switches, gain circuitry and phase circuitry for array elements of the uniform linear antenna array to control gain and phase of the array elements such that the uniform linear antenna array is operated with a beam pattern selected from a set of beam patterns, wherein the set of beam patterns provides a range of directionality and interference nulling, and wherein the beam pattern is selected in dependence on the wireless signals received by the means for transmitting and receiving wireless signals in a uniform circular manner.

* * * * *